(12) United States Patent
Eurlings et al.

(10) Patent No.: US 9,835,950 B2
(45) Date of Patent: Dec. 5, 2017

(54) RADIATION SOURCE

(71) Applicant: ASML Netherlands B.V., Veldhoven (NL)

(72) Inventors: Markus Franciscus Antonius Eurlings, Veldhoven (NL); Niek Antonius Jacobus Maria Kleemans, Veldhoven (NL); Antonius Johannes Josephus Van Dijsseldonk, Veldhoven (NL); Ramon Mark Hofstra, Veldhoven (NL); Oscar Franciscus Jozephus Noordman, Veldhoven (NL); Tien Nang Pham, San Diego, CA (US); Jan Bernard Plechelmus Van Schoot, Veldhoven (NL); Jiun-Cheng Wang, Veldhoven (NL); Kevin Weimin Zhang, San Diego, CA (US)

(73) Assignee: ASML Netherland B.V., Veldhoven (NL)

( * ) Notice: Subject to any disclaimer, the term of this patent is extended or adjusted under 35 U.S.C. 154(b) by 0 days.

(21) Appl. No.: 15/112,602

(22) PCT Filed: Dec. 19, 2014

(86) PCT No.: PCT/EP2014/078631
§ 371 (c)(1),
(2) Date: Jul. 19, 2016

(87) PCT Pub. No.: WO2015/110238
PCT Pub. Date: Jul. 30, 2015

(65) Prior Publication Data
US 2016/0334711 A1 Nov. 17, 2016

Related U.S. Application Data

(60) Provisional application No. 61/989,616, filed on May 7, 2014.

(30) Foreign Application Priority Data

Jan. 27, 2014 (EP) ..................... 14152630

(51) Int. Cl.
*G03B 27/54* (2006.01)
*G03B 27/72* (2006.01)
(Continued)

(52) U.S. Cl.
CPC ..... *G03F 7/70091* (2013.01); *G02B 19/0019* (2013.01); *G02B 27/0905* (2013.01);
(Continued)

(58) Field of Classification Search
CPC ............ G02B 19/0019; G02B 27/0905; G02B 27/0983; G03F 7/70033; G03F 7/70075;
(Continued)

(56) References Cited

U.S. PATENT DOCUMENTS 4,195,913 A 4/1980 Dourte et al.
4,289,380 A 9/1981 Tucker
(Continued)

FOREIGN PATENT DOCUMENTS

DE 19935404 A1 2/2001
EP 1475807 A2 11/2004
(Continued)

OTHER PUBLICATIONS

Zhang et al., "Generation and propagation of hot electrons in laser-plasmas," Laboratory of Optic Physics, Applied Physics B: Lasers and Optics, vol. 80, Jun. 4, 2005; pp. 957-971.
(Continued)

*Primary Examiner* — Colin Kreutzer
(74) *Attorney, Agent, or Firm* — Sterne, Kessler, Goldstein & Fox P.L.L.C.

(57) ABSTRACT

A faceted reflector (32, 32") for receiving an incident radiation beam (2) and directing a reflected radiation beam
(Continued)

at a target. The faceted reflector comprises a plurality of facets, each of the plurality of facets comprising a reflective surface. The reflective surfaces of each of a first subset of the plurality of facets define respective parts of a first continuous surface and are arranged to reflect respective first portions of the incident radiation beam in a first direction to provide a first portion of the reflected radiation beam. The reflective surfaces of each of a second subset of the plurality of facets define respective parts of a second continuous surface and are arranged to reflect respective second portions of the incident radiation beam in a second direction to provide a second portion of the reflected radiation beam.

24 Claims, 8 Drawing Sheets

(51) Int. Cl.
  *H05G 2/00* (2006.01)
  *G03F 7/20* (2006.01)
  *G02B 27/09* (2006.01)
  *G02B 19/00* (2006.01)

(52) U.S. Cl.
  CPC ..... *G02B 27/0983* (2013.01); *G03F 7/70033* (2013.01); *G03F 7/70175* (2013.01); *H05G 2/005* (2013.01); *H05G 2/008* (2013.01)

(58) Field of Classification Search
  CPC ............. G03F 7/70091; G03F 7/70175; G03F 7/70191; H05G 2/005; H05G 2/008
  USPC ............ 250/492.1–492.3, 504 R; 355/67, 71
  See application file for complete search history.

(56) References Cited

U.S. PATENT DOCUMENTS

| 4,315,130 | A | 2/1982 | Inagaki et al. |
| 4,518,232 | A | 5/1985 | Dagenais |
| 4,683,525 | A | 7/1987 | Camm |
| 5,548,444 | A | 8/1996 | McLaughlin et al. |
| 6,038,279 | A | 3/2000 | Miyake et al. |
| 7,071,476 | B2 | 7/2006 | Dirk et al. |
| 2005/0199829 | A1 | 9/2005 | Partlo et al. |
| 2006/0000985 | A1 | 1/2006 | Chandhok et al. |
| 2006/0255298 | A1 | 11/2006 | Bykanov et al. |
| 2012/0162627 | A1 | 6/2012 | Fiolka et al. |
| 2012/0243566 | A1 | 9/2012 | Hori et al. |
| 2012/0248344 | A1* | 10/2012 | Wakabayashi ......... H05G 2/008 250/504 R |
| 2012/0305811 | A1* | 12/2012 | Wakabayashi ......... H05G 2/008 250/504 R |
| 2013/0070221 | A1* | 3/2013 | Bittner ................ G03F 7/70883 355/30 |
| 2013/0105712 | A1* | 5/2013 | Yanagida ............... H05G 2/003 250/504 R |
| 2014/0084183 | A1* | 3/2014 | Wakabayashi ......... H05G 2/008 250/492.1 |
| 2015/0043599 | A1* | 2/2015 | Yanagida ............... H01S 3/1106 372/18 |
| 2017/0127505 | A1* | 5/2017 | Sunahara ............... H05G 2/008 |

FOREIGN PATENT DOCUMENTS

| WO | WO 2014095262 A1 | 6/2014 |
| WO | WO 2015110238 A1 | 7/2015 |

OTHER PUBLICATIONS

Fujioka et al., "Pure-tin microdroplets irradiated with double laser pulses for efficient and minimum-mass extreme-ultraviolet light source production," American Institute of Physics, Applied Physics Letters, vol. 92, Jun. 18, 2008; 4 pages.

International Search Report and Written Opinion of the International Search Authority directed to related International Patent Application No. PCT/EP2014/078631, dated Mar. 31, 2015; 13 pages.

International Preliminary Report on Patentability directed to related International Patent Application No. PCT/EP2014/078631, dated Aug. 2, 2016; 8 pages.

* cited by examiner

Prior Art

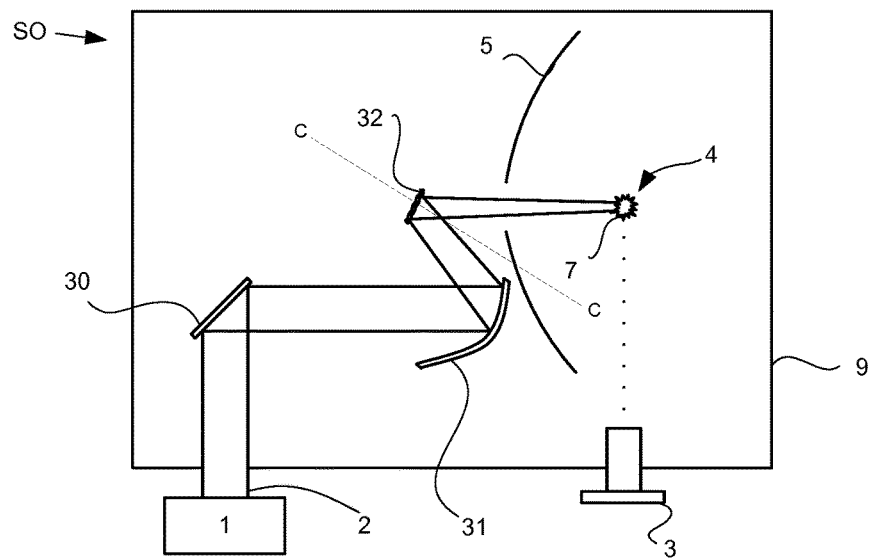
FIG. 4
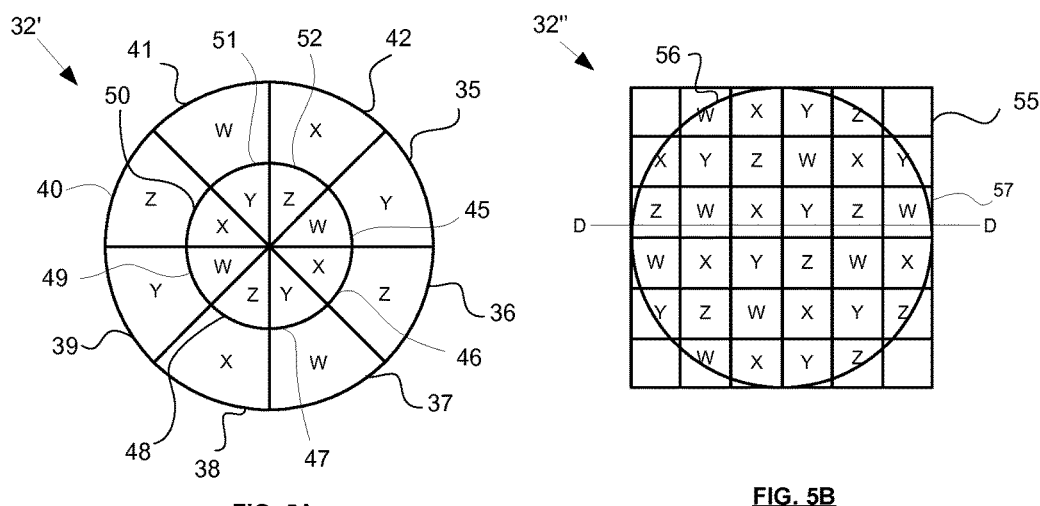
FIG. 5A
FIG. 5B
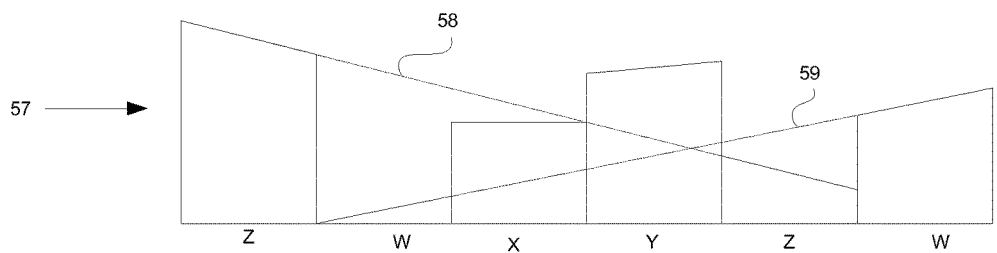
FIG. 6A

RADIATION SOURCE

CROSS-REFERENCE TO RELATED APPLICATIONS

This application claims the benefit of European patent application 14152630.1, which was filed on 27 Jan. 2014 and of U.S. provisional application 61/989,616, which was filed on 7 May 2014, and which are incorporated herein in its entirety by reference.

FIELD

The present invention relates to radiation sources for producing a radiation generating plasma.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation may be produced using a radiation source arranged to generate an EUV producing plasma. An EUV producing plasma may be generated, for example, by exciting a fuel, for example liquid tin, within the radiation source. The fuel may be excited by directing a beam of initiating radiation, such as a laser beam, at a target comprising the fuel, the initiating radiation beam causing the fuel target to become an EUV generating plasma.

To ensure that the radiation source is efficient, it is desired to ensure that as much of the fuel target as possible is excited such that it becomes an EUV generating plasma. Improved tools for directing initiating radiation in order to excite the fuel target are therefore desired. It is also necessary to direct radiation produced by the plasma within a lithographic apparatus. Improved tools for directing radiation more generally, are therefore also desired.

SUMMARY

It is an object of an embodiment described herein to obviate or mitigate one or more of the problems set out above.

According to a first aspect described herein, there is provided a faceted reflector for receiving an incident radiation beam and directing a reflected radiation beam at a target. The faceted reflector comprises a plurality of facets, each of the plurality of facets comprising a reflective surface. The reflective surfaces of each of a first subset of the plurality of facets are arranged to reflect respective first portions of the incident radiation beam in a first direction to provide a first portion of the reflected radiation beam. The reflective surfaces of each of a second subset of the plurality of facets are arranged to reflect respective second portions of the incident radiation beam in a second direction to provide a second portion of the reflected radiation beam.

In this way, the faceted reflector provides a reflector suitable for providing a reflected radiation beam that has an intensity profile that is different to the incident radiation beam.

The reflective surfaces of the first subset may define respective parts of a first continuous surface. The reflective surfaces of the second subset may define respective parts of a second continuous surface different to the first continuous surface.

The plurality of facets may be arranged such that at least a part of the first portion of the reflected radiation beam and at least a part of the second portion of the reflected radiation beam overlap at the target.

Reflective surfaces of each of the plurality of facets may belong to one of at least three subsets, the reflective surfaces of the facets of each subset being arranged to reflect respective portions of the incident radiation beam in a respective direction, the respective portions together providing a respective portion of the reflected radiation beam.

The plurality of facets may be arranged such that at least part of each respective portion of the reflected radiation beam overlaps with at least part of at least one other of the respective portions of the reflected radiation beam at the target.

The plurality of facets may be arranged to increase homogeneity of intensity within a portion of a cross-section of the reflected radiation beam at the target.

The plurality of facets may be arranged so as to increase a minimum intensity within a portion of a cross-section of the reflected radiation beam the target.

The plurality of facets may be arranged so as to increase an intensity within a central portion of a cross-section of the reflected radiation beam at the target.

The cross-section of the reflected radiation beam is taken in a plane that lies perpendicular to the direction of propagation of the reflected radiation beam. This may be referred to as an axial cross-section.

When viewed in top-down perspective the plurality of facets comprises a disk of facets arranged as a plurality of equally sized sectors. In other embodiments, however, additional subsets may be provided.

When viewed in top-down perspective, the plurality of facets comprises a ring of equally sized circumferentially distributed facets. In other embodiments, the sectors and/or the circumferentially distributed may be of different sizes.

When viewed in top-down perspective, the plurality of facets comprises a grid of equally sized square facets. In other embodiments, the grid may comprise facets of different sizes, and/or shapes.

The reflective surfaces of the facets of the first subset may define a first plane and/or the reflective surfaces of the facets of the second subset may define a second plane.

The first continuous surface may be curved. For example, the first continuous surface may be concave or convex.

It may be that a gradient of the first continuous surface is not greater at any point between two of the first subset of facets than at a point on the continuous surface that intersects the reflective surface of at least one of the first subset of facets. That is, for between bounds defined by the facets of the first subset, the continuous surface may be steepest at a point that intersects the reflective surface of one of the facets in the first subset of facets.

Similarly, the second continuous surface may be curved.

A connecting portion between a first facet in the first subset and an adjacent facet in the second subset may define a gradual transition between the reflective surface first facet and the reflective surface of the second facet.

The faceted reflector may define an average plane. The faceted reflector may be arranged such that the connecting portion is at an angle to the average plane that is less than an angle of incidence of the incident radiation beam with respect to the average plane.

According to a second aspect of the present invention, there is provided a radiation source for generating a radiation emitting plasma, the radiation source being arranged to receive an initiating radiation beam and comprising: a faceted reflector arranged to receive the initiating radiation beam and direct a reflected initiating radiation beam at a fuel target at the plasma formation region to generate a radiation emitting plasma, the faceted reflector comprising a plurality of facets, each of the plurality of facets comprising a reflective surface; wherein the reflective surfaces of each of a first subset of the plurality of facets are arranged to reflect respective first portions of the incident initiating radiation beam in a first direction to provide a first portion of the reflected initiating radiation beam; and wherein the reflective surfaces of each of a second subset of the plurality of facets are arranged to reflect respective second portions of the incident initiating radiation beam in a second direction to provide a second portion of the reflected initiation radiation beam.

In this way, radiation reflected from a fuel target at the plasma formation location is deflected before reaching a source of the initiating radiation. Where the source of the initiating radiation is a laser, deflecting reflected radiation reduces parasitic lasing that can occur as a result of reflected radiation re-entering the laser, thereby reducing energy drain and improving efficiency. Further, by providing a faceted reflector in the path of the initiating radiation, the facets can be arranged to provide desired intensity profile of the initiating radiation at the plasma formation region.

The reflective surfaces of the first subset may define respective parts of a first continuous surface. The reflective surfaces of the second subset may define respective parts of a second continuous surface different to the first continuous surface.

The plurality of facets may be arranged such that at least a part of the first portion of the reflected initiating radiation beam and at least a part of the second portion of the reflected initiating radiation beam overlap at the target.

The reflective surfaces of each of the plurality of facets may belong to one of at least three subsets, the reflective surfaces of the facets of each being arranged to reflect respective portions of the incident initiating radiation beam in a respective direction, the respective portions together providing a respective portion of the reflected initiating radiation beam.

The plurality of facets may be arranged such that at least part of each respective portion of the reflected initiating radiation beam overlaps with at least part of at least one other of the respective portions of the reflected initiating radiation beam at the target.

The plurality of facets may be orientated so as to increase homogeneity of intensity within a portion of a cross-section of the initiating radiation beam at the plasma formation region.

By increasing homogeneity of intensity, a fuel target provided at the plasma formation region is excited more evenly, increasing the amount of the fuel target that may be converted into a radiation emitting plasma, and thereby increasing the efficiency of the radiation source.

The plurality of facets may be orientated so as to increase a minimum intensity within a portion of a cross-section of the initiating radiation beam at the plasma formation region. The plurality of facets may be oriented so as to increase an intensity within a central portion of a cross-section of the initiating radiation beam at the plasma formation region.

In this way, problems in prior art radiation sources in that a portion of the initiating radiation provides insufficient intensity to ignite a portion of a fuel target with that it interacts is mitigated.

The portion of the cross-section of the initiating radiation beam may be a portion of the initiating radiation beam that is, in use, substantially concentric with a fuel target at the plasma formation region. While the intensity of the cross-section of the radiation beam may reduce beyond a certain radius, the faceted reflector may be arranged such that a portion of the radiation beam that interacts with a fuel target has sufficient intensity to result in the generation of a radiation producing plasma across the entirety of that portion.

Each of a third subset of the plurality of facets may be arranged to direct portions of the initiating radiation beam in a third direction and each of a fourth subset of the plurality of facets may be arranged to direct portions of the initiating radiation beam in a fourth direction.

Each of the plurality of facets may belong to one of the first, second, third or fourth subsets. That is, exactly four subsets may be provided. In other embodiments, however, additional subsets may be provided.

When viewed in top-down perspective the faceted reflector may comprise an inner disk of facets arranged as a plurality of equally sized sectors. The faceted reflector may further comprise an outer ring of equally sized circumferentially distributed facets. In other embodiments, the sectors and/or the circumferentially distributed may be of different sizes.

When viewed in top-down perspective, the faceted reflector may comprise a grid of equally sized square facets. In other embodiments, the grid may comprise different sized facets, or facets of shapes other than square, for example, rectangular.

The first continuous surface may be curved. For example, the first continuous surface may be concave or convex.

It may be that a gradient of the first continuous surface is not greater at any point between two of the first subset of facets than at a point on the continuous surface that intersects the reflective surface of at least one of the first subset of facets. That is, for between bounds defined by the facets of the first subset, the continuous surface may be steepest at a point that intersects the reflective surface of one of the facets in the first subset of facets.

The radiation source may further comprise a radiation collector for collecting radiation generated by a radiation generating plasma at the plasma formation region, and for directing at least a portion of the generated radiation to a focal point.

According to a third aspect, there is provided a radiation system, comprising a radiation source according to the first aspect, and a first laser arranged to provide the initiating radiation beam.

The radiation system may further comprise a second laser arranged to direct a fuel modifying radiation beam at a fuel target to alter a property of the fuel target before the initiating radiation is incident on the fuel target at the plasma formation region.

According to a fourth aspect, there is provided a lithographic tool comprising a faceted reflector according to the first aspect, a radiation source according to the second aspect or a radiation system according to the third aspect.

According to a fifth aspect, there is provided a lithographic apparatus comprising an illumination system configured to condition a radiation beam received from a radiation source according to the second aspect; a support structure constructed to support a patterning device, the patterning device being capable of imparting the radiation beam with a pattern in its cross-section to form a patterned radiation beam; a substrate table constructed to hold a substrate; and a projection system configured to project the patterned radiation beam onto the substrate.

According to a sixth aspect there is provided a radiation system for generating radiation, comprising a faceted reflector according to the first aspect.

According to a seventh aspect, there is provided a radiation source comprising a fuel emitter configured to provide a fuel and direct the fuel so as to provide a fuel target and a beam apparatus configured to direct an initiating radiation beam to be incident on the fuel target such that the intensity of the initiating radiation beam is greater than a threshold intensity over substantially the whole cross-section of the fuel target.

The fuel target is a portion or region of fuel that is to be excited to form a plasma. The fuel target may comprise a droplet of fuel. The fuel target may comprise a portion of a droplet of fuel. The fuel target may comprise a portion of a stream of fuel. The fuel target may comprise a portion of a fuel that is provided on an electrode. The electrode may form part of a discharge produce plasma radiation source.

The cross-sections of the initiating radiation beam and the fuel target are taken in a plane that lies perpendicular to the direction of propagation of the initiating radiation beam.

The initiating radiation beam may be a main-pulse laser beam that acts to excite the fuel to form a plasma. The plasma may be an EUV radiation emitting plasma. The initiating radiation beam may be a pre-pulse laser beam that acts to change the shape of the fuel target so as to provide a fuel target of a desired shape to a further initiating radiation beam that may, for example, be a main-pulse laser beam. The initiating radiation beam may be a laser beam that is incident on a fuel target on an electrode. The electrode may form part of a discharge produce plasma radiation source.

The threshold intensity may be an intensity that causes the fuel within the fuel target to be excited into a plasma. The threshold intensity may be an intensity that causes the fuel target to be excited into an EUV radiation emitting plasma. The threshold intensity may be an intensity that causes a desired change in shape of the fuel target. The threshold intensity may be an intensity that causes ablation of the fuel target from an electrode. The electrode may form part of a discharge produce plasma radiation source.

The beam apparatus causes the intensity of the initiating radiation beam to be greater than the threshold intensity over substantially the whole cross-section of the fuel target. The beam apparatus may therefore increase the amount of fuel that is excited to form a plasma and may increase the amount of radiation that is emitted from the plasma. The beam apparatus therefore increases a conversion efficiency of the radiation source where the conversion efficiency is the amount of radiation that is emitted from the plasma per unit of energy from the initiating radiation beam.

The initiating radiation beam may have a cross-sectional area at the plasma formation region that is greater than or equal to a cross-sectional area of the fuel target such that the cross-section of the initiating radiation beam entirely encompasses (or overlaps) the cross-section of the fuel target.

The beam apparatus may comprise at least one optical element configured to increase a fraction of the cross-section of the initiating radiation beam at the fuel target over that the intensity of the radiation beam is greater than the threshold intensity.

The beam apparatus may comprise at least one optical element configured to increase a homogeneity of intensity within a portion of a cross-section of the initiating radiation beam at the fuel target.

The beam apparatus may comprise at least one optical element configured to increase a minimum intensity within a portion of a cross-section of the initiating radiation beam at the fuel target.

The beam apparatus may comprise at least one optical element configured to increase an intensity within a central portion of a cross-section of the initiating radiation beam at the fuel target.

The radiation source may further comprise a sensing apparatus operable to measure one or more properties of the initiating radiation beam and the at least one optical element may be adaptable in response to a measurement of one or more properties of the initiating radiation beam made by the sensing apparatus.

The sensing apparatus may comprise a sensor operable to measure an intensity profile of the initiating radiation beam.

The sensing apparatus may comprise a wavefront sensor operable to measure wavefront aberrations in the initiating radiation beam.

The sensing apparatus may comprise an optical element on that the initiating radiation beam is incident and a temperature sensor operable to measure the temperature of the optical element.

The at least one optical element may comprise a faceted reflector comprising a plurality of facets, each of the plurality of facets comprising a reflective surface. Where a faceted reflector is provided, the sensing apparatus may comprise one or more sensors positioned between one or more facets of the faceted reflector.

The faceted reflector may comprise a faceted reflector according to the first aspect.

The faceted reflector may comprise a field facet mirror comprising a plurality of field facets and the beam apparatus may further comprise a pupil facet mirror comprising a plurality of pupil facets.

The field facets of the field facet mirror may each be configured to image a portion of the intensity profile of the initiating radiation beam onto a respective pupil facet of the pupil facet mirror and each of the pupil facets may be configured to image the portion of the intensity profile onto the fuel target.

The field facets and the pupil facets may be configured to image portions of the intensity profile of the initiating radiation beam onto the fuel target so as to increase a fraction of the cross-section of the initiating radiation beam at the fuel target over which the intensity of the initiating radiation beam is greater than the threshold intensity.

The at least one optical element may comprise a deformable mirror.

The radiation source may further comprise an adaptive optics system comprising the deformable mirror, a wavefront sensor arranged to measure wavefront aberrations in the initiating radiation beam and a controller configured to adapt a shape of a reflective surface of the deformable mirror in response to a measurement made by the wavefront sensor.

The adaptive optics system may further comprise a beam splitter configured to direct a portion of the initiating radiation beam to the wavefront sensor.

The beam apparatus may comprise a laser configured to provide the initiating radiation beam.

The laser may be configured to provide an incoherent initiating radiation beam.

The laser may comprise a seed laser and an amplification chain.

The seed laser may be configured to operate in a plurality of transverse modes.

The seed laser may be configured to operate in a plurality of longitudinal modes.

The seed laser may be a gas discharge laser.

The seed laser may be a CO2 laser.

The amplification chain may comprise a gas that is pumped by electrical discharge.

According to an eighth aspect there is provided a lithographic tool comprising a radiation source according to the seventh aspect.

According to a ninth aspect there is provided a lithographic apparatus comprising an illumination system configured to condition a radiation beam received from a radiation source according to the seventh aspect, a support structure constructed to support a pattering device, the pattering device being capable of imparting the radiation beam with a pattern in its cross-section to form a patterned radiation beam, a substrate table constructed to hold a substrate and a projection system configured to project the patterned radiation beam onto the substrate.

According to a tenth aspect there is provided a radiation source comprising a fuel emitter configured to emit a fuel and direct the fuel to a plasma formation region so as to provide a fuel target at the plasma formation region and an optical element configured to direct an initiating radiation beam to be incident on the fuel target at the plasma formation region, wherein the optical element is configured to increase a fraction of the cross-section of the initiating radiation beam at the fuel target over which the intensity of the radiation beam is greater than a threshold intensity.

This may cause the intensity of the initiating radiation beam to be greater than the threshold intensity over substantially the whole cross-section of the fuel target. The threshold intensity may be an intensity that causes the fuel within the fuel target to be excited into a plasma. The optical element increases the amount of fuel that is excited to form a plasma and increases the amount of radiation that is emitted from the plasma. The optical element therefore increases a conversion efficiency of the radiation source where the conversion efficiency is the amount of radiation that is emitted from the plasma per unit of energy from the initiating radiation beam.

According to an eleventh aspect there is provided a radiation source comprising a fuel emitter configured to emit a fuel and direct the fuel to a plasma formation region so as to provide a fuel target at the plasma formation region and a laser configured to provide an incoherent initiating radiation beam; the radiation source is configured to direct the initiating radiation beam to be incident on the fuel target at the plasma formation region.

Providing an incoherent initiating radiation beam reduces the sensitivity of an intensity profile of the initiating radiation beam to optical aberration in optical elements used to direct the initiating radiation beam to be incident on the fuel target. This may cause the intensity of the initiating radiation beam to be greater than a threshold intensity over substantially the whole cross-section of the fuel target. The threshold intensity may be an intensity that causes the fuel within the fuel target to be excited into a plasma. Providing an incoherent initiating radiation beam therefore increases the amount of fuel that is excited to form a plasma and increases the amount of radiation that is emitted from the plasma. Providing an incoherent initiating radiation beam therefore increases a conversion efficiency of the radiation source where the conversion efficiency is the amount of radiation that is emitted from the plasma per unit of energy from the initiating radiation beam.

It will be appreciated that one or more aspects or features described in the preceding or following descriptions may be combined with one or more other aspects or features.

BRIEF DESCRIPTION OF THE DRAWINGS

Embodiments of the invention will now be described, by way of example only, with reference to the accompanying schematic drawings, in which:

FIG. 4 schematically depicts a radiation source according to an embodiment of the invention;

FIG. 5A schematically depicts one arrangement of facets within a faceted reflector of the radiation source of FIG. 4;

FIG. 5B schematically depicts an alternative arrangement of facets within a faceted reflector of the radiation source of FIG. 4;

FIGS. 6A, 6B schematically depict a plurality facets within the arrangement of FIG. 5B;

DETAILED DESCRIPTION

Figure 1:
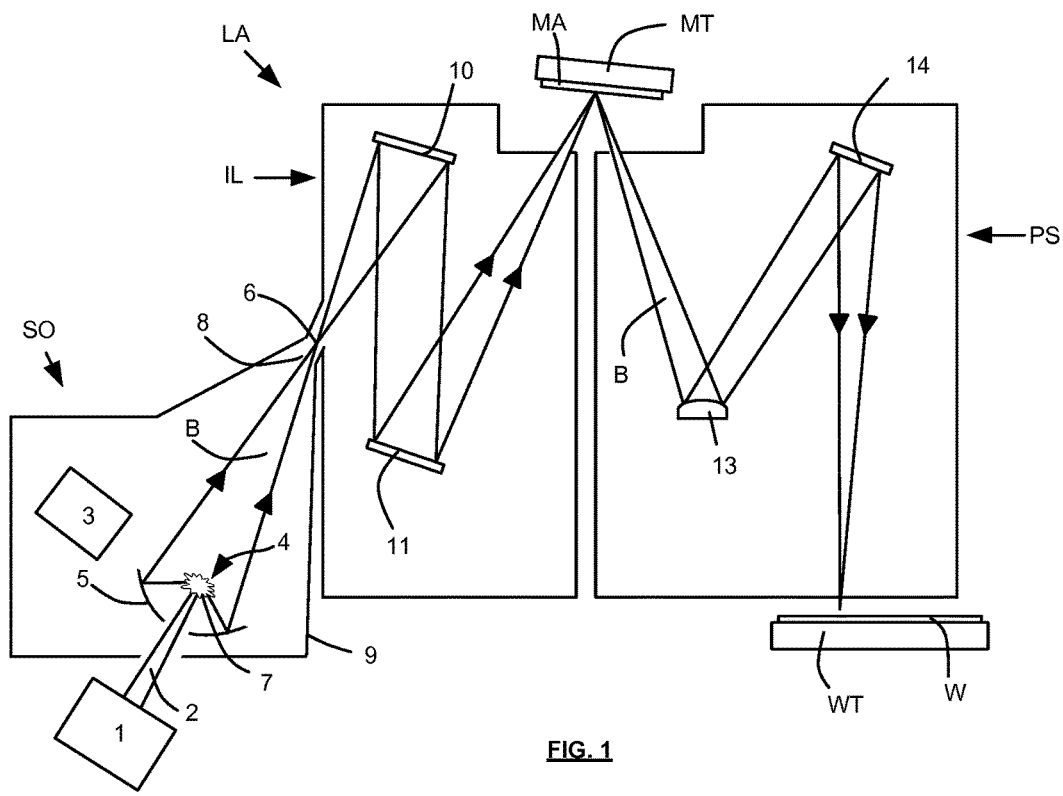
FIG. 1 schematically depicts a lithographic system comprising a lithographic apparatus and a radiation source according to an embodiment of the invention.

FIG. 1 shows a lithographic system including a radiation source SO according to one embodiment of the invention.

The lithographic system further comprises a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g., a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, which is provided from a fuel emitter 3. The laser beam 2 may be referred to as an initiating radiation beam. The fuel may for example be in liquid form, and may for example be a metal or alloy, such as tin (Sn). Although tin is referred to in the following description, any suitable fuel may be used. The fuel emitter 3 is configured to emit a fuel and direct the fuel to a plasma formation region 4 so as to provide a fuel target at the plasma formation region 4. The fuel emitter 3 may comprise a nozzle configured to direct tin, e.g., in the form of droplets, along a trajectory towards the plasma formation region 4. The laser beam 2 is incident upon the tin at the plasma formation region 4. The deposition of laser energy into the tin excites the tin to form a plasma 7 at the plasma formation region 4. Radiation, including EUV radiation, is emitted from the plasma 7 during de-excitation and recombination of ions of the plasma. The laser beam 1 may be used in a pulsed configuration, such that the laser beam 2 is a laser pulse. Where the fuel is provided as a droplet, a respective laser pulse may be directed at each fuel droplet.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown in FIG. 1) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, that is configured to condition the radiation beam B. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may, for example, be applied. Although the projection system PS has two mirrors in FIG. 1, the projection system may include any number of mirrors.

Figure 2:
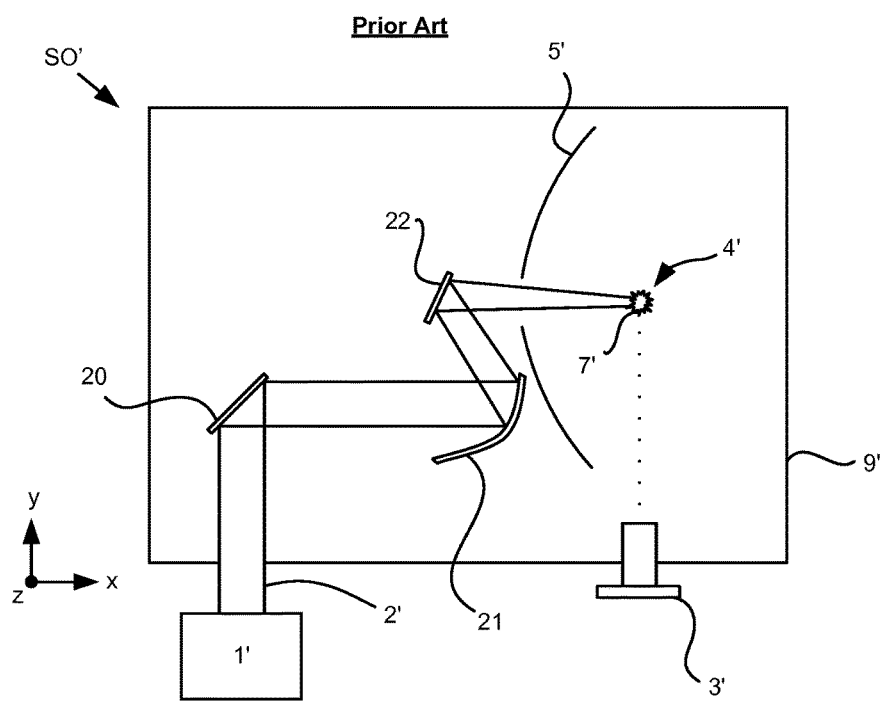
FIG. 2 schematically depicts a known radiation source.

FIG. 2 schematically illustrates a prior art laser produced plasma (LPP) radiation source SO'. The radiation source SO' comprises a laser 1', which may for example be a CO2 laser, arranged to deposit energy via a laser beam 2' into a fuel, which is provided from a fuel emitter 3'. The fuel emitter 3' may comprise a nozzle configured to direct the fuel, in the form of droplets, along a trajectory towards a plasma formation region 4'. The laser beam 2' is incident upon the fuel target at the plasma formation region 4'. The deposition of laser energy into the fuel targets creates a plasma 7' at the plasma formation region 4'. Radiation, including EUV radiation, is emitted from the plasma 7' during de-excitation and recombination of ions of the plasma 7'. The laser beam 1' is used in a pulsed configuration, such that the laser beam 2' is a laser pulse. A respective laser pulse is directed at each fuel droplet.

The EUV radiation is collected and focused by a near normal incidence radiation collector 5'.

Each fuel droplet provided by the fuel emitter 3' provides a fuel target at which the laser beam 2' is directed via a directing apparatus. The directing apparatus of the radiation source SO' comprises three reflectors 20, 21, 22. Collectively, the reflectors 20, 21, 22 direct and focus the laser beam 2 towards the plasma formation region 4. The reflectors 20, 21, 22 each comprise a single substantially continuous (i.e., smooth, or unbroken) reflective surface.

To efficiently generate a plasma at the plasma formation region 4' the radiation source SO is arranged so that laser beam 2' encompasses the fuel target at the plasma formation region 4'. That is, the laser beam 2' is directed such that it has a cross section (in the y-z plane as shown in the spatial axes provided in FIG. 3), at the plasma formation region 4, that is at least as large as the fuel target (in the y-z plane).

An initial pulse of laser radiation, known as a pre-pulse, may be directed at the fuel droplet before the fuel droplet reaches the plasma formation region 4'. The pre-pulse may be provided by the laser 1', or by a separate laser (not shown). Upon the fuel target reaching the plasma formation region 4', a second pulse of laser radiation in the form of the laser beam 2', which in this case may be referred to as a main-pulse, is directed at the fuel target to generate an EUV producing plasma. The pre-pulse acts to change the shape of the fuel target so that the fuel target is in a desired shape when it reaches the plasma formation region 4'. For example, the fuel target may be emitted from the fuel emitter 3' with a generally spherical distribution. A pre-pulse directed at a spherical fuel target may cause a flattening of the fuel target such that the fuel target presents a disk, or pancake-like shape at the plasma formation region 4'. Where a pre-pulse is utilised to modify the fuel target, the radiation source SO' is arranged such that the laser beam 2' (or main pulse) has a cross section (in the y-z plane) sufficiently large to encompass the modified fuel target at the plasma formation region 4'. For example, the laser beam 2' may be focused so as to have a cross section of approximately 300 μm.

In order to ensure that the main pulse has a sufficiently large cross-section to encompass the fuel target (whether modified by a pre-pulse or otherwise), the radiation source SO' is arranged such that the laser beam 2' is not in focus at the point of incidence with the fuel target. That is, the plasma formation region 4' does not coincide with the beam waist of the laser beam 2', but rather with a less converged portion of the laser beam 2'. However, by using an unfocussed portion of the laser beam 2', the laser beam 2' does not have a homogeneous intensity profile at the plasma formation region 4'. This may lead to areas of the fuel target receiving insufficient laser radiation to convert the fuel in those areas into an EUV generating plasma. Indeed, it has been determined that the shape of the laser beam 2' at the fuel target is such that some portions of the fuel target receive substantially no laser radiation.

Figure 3A:
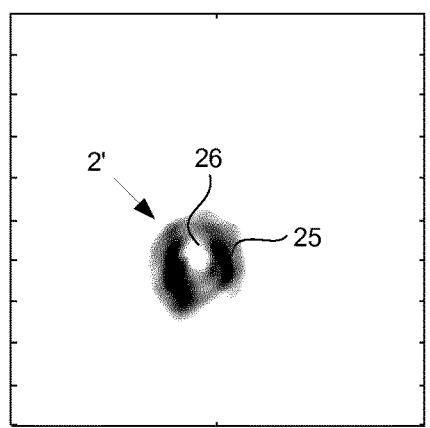
FIGS. 3A, 3B, 3C show an intensity profile of a cross-section of a laser beam at a plasma formation region within the radiation source of FIG. 2.
Figure 3B:
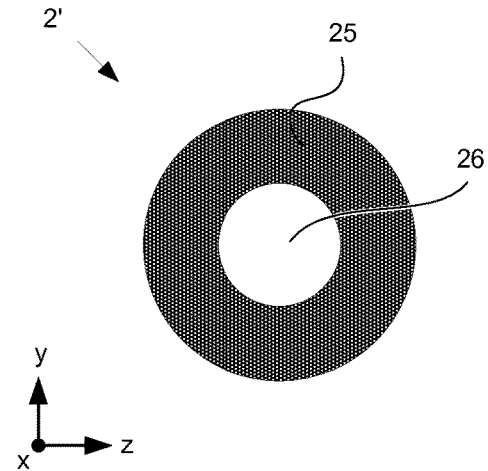
Figure 3C:
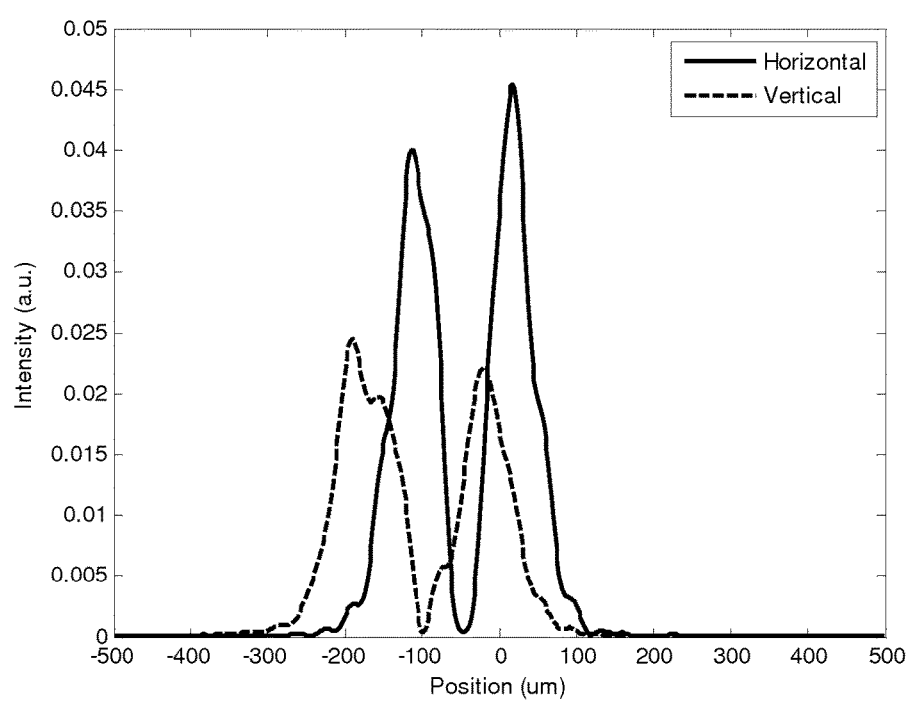

FIG. 3A shows the intensity profile of a cross section of the laser beam 2' in the y-z plane at the plasma formation region 4' of the radiation source SO'. FIG. 3B schematically illustrates the intensity profile shown in FIG. 3A for clarity. In both FIGS. 3A and 3B it can be seen that the profile of the laser beam 2' comprises an outer portion 25 of relatively high intensity and an inner portion 26 of low, near zero intensity. Portions of a fuel target that are incident with the inner portion 26 of the laser beam 2' would therefore not receive sufficient radiation to produce an EUV generating plasma. FIG. 3C is a graph showing the intensity profile, in both y-(labelled vertical) and z-(labelled horizontal) directions, shown in FIG. 3A from which it can also be clearly seen that a central portion of the laser beam 2' has an area of very low intensity.

The inhomogeneity in the intensity profile of the laser beam 2' that is shown in FIGS. 3A-3C may, for example, be caused by optical aberrations in optical elements of the directing apparatus of the radiation source SO'. For example, one or more of the reflectors 20, 21, 22 of the directing apparatus depicted in FIG. 2 may include optical aberrations. Additionally or alternatively optical aberrations may be present in optical elements of a beam delivery system that is configured to deliver the laser beam 2' to the radiation source SO' from the laser 1'. Optical aberrations in optical elements of a beam directing apparatus and/or a beam delivery apparatus may introduce wavefront aberrations in the laser beam 2'. Wavefront aberrations in the laser beam 2' may cause destructive interference to occur in some portions of the cross-section of the laser beam 2' that may, for example, cause the low intensity inner portion 26 of the intensity profile of the laser beam 2'.

Various embodiments of the radiation source SO of FIG. 1 will now be described in detail. Each of the embodiments include a beam apparatus that is configured to increase a fraction of the cross-section of the radiation beam 2 over which the intensity of the laser beam 2 is greater than an intensity threshold. The intensity threshold may be an intensity that causes fuel within a fuel target to be excited into a plasma. As will be described further below the beam apparatus may take different forms in different embodiments.

FIG. 4 illustrates an embodiment of the radiation source SO of FIG. 1, in more detail. Like the radiation source SO', the radiation source SO comprises a beam directing apparatus comprising three reflectors 30, 31, 32, which collectively act to direct and focus the laser beam 2 towards the plasma formation region 4. The reflectors 30, 31 each comprise a single substantially continuous (i.e., smooth or unbroken) reflective surface. The reflector 32, however, comprises a plurality of individual facets. Each facet of the faceted reflector 32 is tilted with respect to the surface of at least another one of the facets of the reflector 32 so that portions of the laser beam 2 are reflected in different directions.

FIGS. 5A and 5B schematically illustrate example arrangements 32', 32" of the reflector 32. FIGS. 5A and 5B are viewed along the line C in FIG. 4 and can be considered to provide a top-down perspective of the reflector 32. Referring to FIG. 5A, a reflector 32' presents a circular outline and comprises an inner disk having eight facets made up of equally sized sectors 35 to 42, and an outer ring of eight equally sized, circumferentially distributed facets 45 to 52. Each of the facets 35-42 and 45-52 has one of four orientations W, X, Y, Z. In this way, a portion of the laser beam 2 that falls on a facet with a W orientation is reflected in a first direction, a portion of the laser beam 2 that falls on a facet with an X orientation is reflected in a second direction, a portion of the laser beam 2 that falls on a facet with a Y orientation is reflected in a third direction and a portion of the laser beam 2 that falls on a facet with a Z orientation is reflected in a third direction. The laser beam 2 is incident on substantially the whole of the reflector 32'. Each of the plurality of facets therefore belongs to one of four subsets, each subset of facets being arranged to direct the initiating radiation in one of four directions towards the plasma formation region 4.

In the arrangement of FIG. 5B, the reflector 32" presents a square outline 55 sub-divided into a grid of thirty-six equally sized square facets. As in the arrangement of FIG. 5A, each facet has one of the four orientations W, X, Y or Z. As such, in the same way as the arrangement of FIG. 5A, the arrangement of FIG. 5B reflects respective portions of the laser beam 2 in one of four directions. The laser beam 2 is incident on a circular area 56 of the reflector 32".

It will be appreciated that the arrangements of FIGS. 5A and 5B are merely exemplary, and that the reflector 32 may be arranged differently. Indeed, the reflector 32, and each of the facets, may take any of a number of shapes and orientations. For instance, in the example of FIG. 5A there are four facets in each of the four subsets, while in the arrangement of FIG. 5B there are eight facets in each of the four subsets. In other embodiments, there may be more or fewer facets in each subset. In some embodiments, the reflector 32 may contain subsets with differing numbers of facets. One or more subsets may contain a single facet.

In an embodiment, a maximum tilt of each facet (i.e., the tilt at an edge portion of the facet) in either the y- or z-direction may be +0.15 times the principle wavelength of the laser beam 2 (at one edge of the facet) and of −0.15 times the principle wavelength of the laser beam 2 (at an opposing edge of the facet) with respect to an average height of the facet.

In some embodiments, the reflective surfaces of facets within a particular subset define respective parts of a continuous surface. For example, in some embodiments, the reflective surfaces of facets within a particular subset define a plane, with each subset defining a different plane. FIG. 6A illustrates a side-profile (viewed along a line perpendicular to the line C in FIG. 4 and perpendicular to the line D shown in FIG. 5B) of a row of facets 57 within the arrangement 32" of FIG. 5B. There are two facets in the row 57 having a "Z" orientation (viewed from left-to-right these are the first and penultimate facets in the row 57). A side-profile of a portion of a plane 58 defined by the reflective surfaces of the facets having a "Z" orientation is depicted in dotted outline. It is to be understood that the reflective surfaces of other facets within the arrangement 32" having a "Z" orientation (i.e., not in the row 57) also lie within the plane 58. A side-profile of a portion of a plane 59 defined by the reflective surfaces of the facets having a "W" orientation is also depicted in FIG. 6. The reflective surfaces of the facets having "X" orientations and "Y" orientations also define respective planes.

Figure 6B:
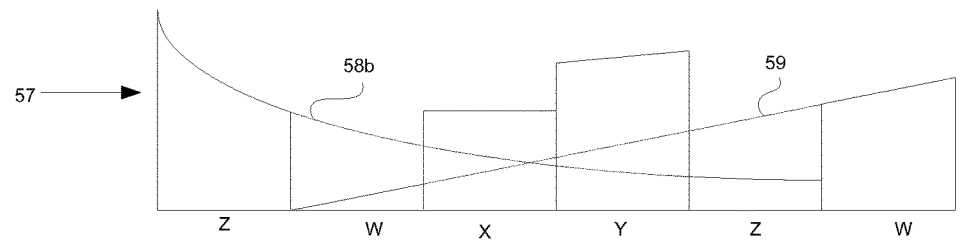

FIG. 6B illustrates a side-profile view (along a line perpendicular to the line C in FIG. 4 and perpendicular to the line D shown in FIG. 5B) of a row of facets 57 within the arrangement 32" of FIG. 5B according to another example. The example of FIG. 6B is generally similar to the example of FIG. 6A except that in the example of FIG. 6B, the reflective surfaces of the facets in the Z orientation define a single continuous concave surface 58b between bounds defined by the facets in the Z orientation.

It can be seen that, when viewed in side-profile the continuous curved surface appears as a line 58b intersecting all points along the reflective surfaces of each of the facets in the Z orientation. In some embodiments, the line 58b may be defined by a continuous function. In some embodiments, for all points along the line 58b between the facets in the Z orientation (i.e., points on the line 58b that occupy gaps between the facets in the Z orientation), the derivative of a function defining the line 58b never exceeds the derivative of at least one point on the line 58b that intersects one of the facets. That is, the line 58b is never at a steepest gradient in a gap between two facets in the Z orientation. Or put yet another way, there is always a point on the line 58b that intersects a facet (in the Z orientation subset) that is steeper than the steepest point on the line 58b that is between two facets (in the Z orientation subset).

More generally, in some embodiments, for any subset of facets (i.e., facets having the same orientation) that have reflective surfaces defining respective parts of a continuous surface (i.e., such that the continuous surface intersects all points of the reflective surfaces of that subset of facets), there is always at least one point on the continuous surface intersecting a reflective surface of a facet within the subset that has a gradient greater or equal to the gradient of any point on the continuous surface that is between two of the facets within the subset. In this way, an improved distribution may be achieved within laser radiation at the fuel target.

It is to be understood that both the embodiments of FIGS. 6A and 6B are merely exemplary, and that the reflective surfaces of the facets within a subset may define a single planar or a single curved surface.

Figure 7:
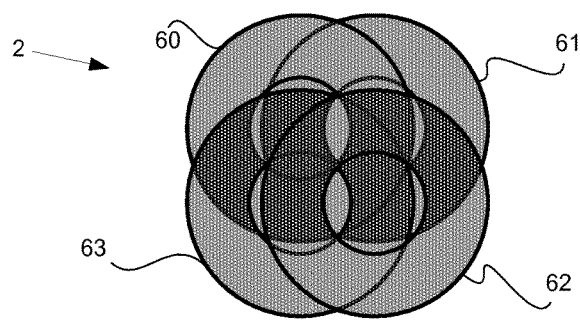
FIG. 7 schematically depicts a cross-section of a laser beam at a plasma formation region within the radiation source of FIG. 4.

FIG. 7 illustrates a cross-section, through the y-z plane at the plasma formation region 4, of the laser beam 2 after reflection by the facetted reflector 32 arrangement in accordance with either FIG. 5A or 5B (i.e., having facets each with one of four distinct orientations). Referring to FIG. 7 it can be seen that after reflection the laser beam 2 comprises four portions 60, 61, 62, 63 each made up of portions of the laser beam 2 reflected from facets having a particular one of the tilts W, X, Y, Z.

For example, referring to FIG. 5A, the portion 60 may comprise portions of the radiation beam 2 that are reflected from the facets 37, 41, 45 and 49 (i.e., those having an W orientation), the portion 61 may comprise portions of the radiation beam 2 that are reflected from the facets 38, 42, 46 and 50 (those having an X orientation), the portion 62 may comprise portions of the radiation beam 2 that are reflected from the facets 35, 39, 47 and 51 (those having a Y orientation) and the portion 63 may comprise portions of the radiation beam 2 that are reflected from the facets 36, 40, 48 and 52 (those having a Z orientation).

As the laser beam 2 is split into a number of portions by reflector 32, each of which overlaps only in part, each of the portions 60-63 may be more tightly focused at the plasma formation region 4 than the laser beam 2' in the arrangement of FIG. 2 while maintaining a total cross-section of the laser beam 2 that is greater than or equal to the cross-section of the fuel target at the plasma formation region 4, where the cross-sections of the laser beam 2 and the fuel target are taken in a plane that lies perpendicular to the direction of propagation of the laser beam 2. In some embodiments the fuel target may comprise a single droplet of fuel that is directed to the plasma formation region 4 and the cross-section of the laser beam 2 may be greater than or equal to the cross-section of the droplet of fuel. However in alternative embodiments a continuous stream of fuel may be directed through the plasma formation location. In such embodiments the fuel target comprises a portion of the fuel stream that is to be excited to form a plasma. In general the fuel target is a region or portion of fuel that is to be excited to form a plasma.

To aid understanding, each of the portions 60-63 is represented in FIG. 7 in the same way as the laser beam 2' in FIG. 3A (i.e., as a complete ring). It will be appreciated, however, each portion 60-63 may contain gaps (i.e., may not comprise a solid ring of radiation as depicted), given that each portion 60-63 is made up from only portions of the laser beam 2. The arrangement of the gaps within each of the portions 60-63 will of course depend upon the arrangement of the facets within the reflector 32.

Figure 8A:
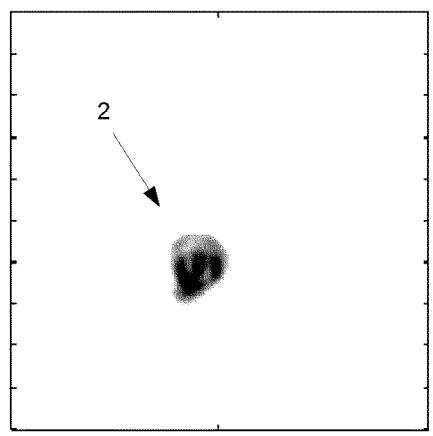
FIGS. 8A, 8B show an intensity profile of a cross-section of a laser beam at a plasma formation region within the radiation source of FIG. 4 comprising a faceted reflector arranged as shown in FIG. 5A.
Figure 8B:
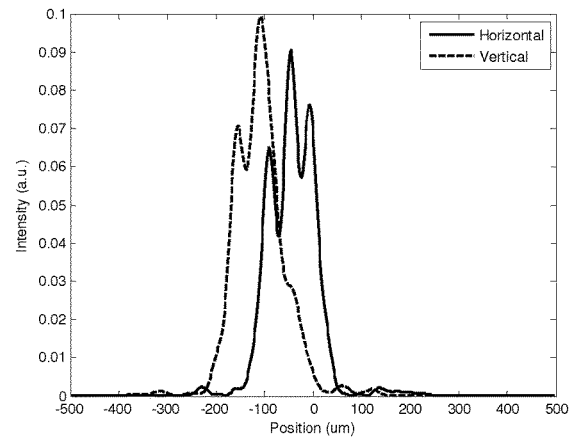
Figure 9A:
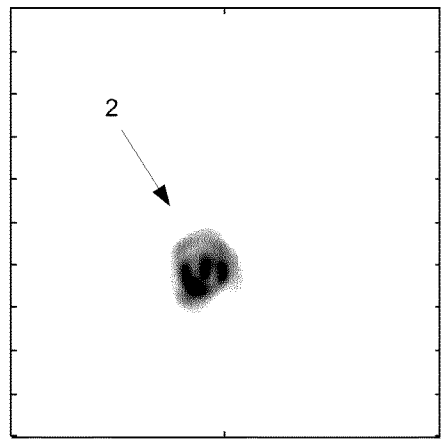
FIGS. 9A, 9B show an intensity profile of a cross-section of a laser beam at a plasma formation region within the radiation source of FIG. 4 comprising a faceted reflector arranged as shown in FIG. 5B.
Figure 9B:
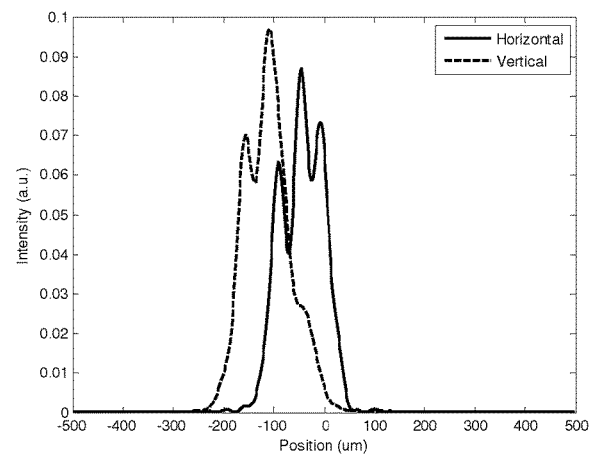

For contrast with the intensity profile shown in FIGS. 3A, 3C, FIG. 8A shows an intensity profile of a cross section of the laser beam 2 in the y-z plane at the plasma formation region 4 of the radiation source SO using a reflector 32 arranged according to FIG. 5A, while FIG. 9A shows an intensity profile of a cross section of the laser beam 2 in the y-z plane at the plasma formation region 4 of the radiation source SO using a reflector 32 arranged according to FIG. 5B. FIG. 8B shows a plot of the intensity profile of FIG. 8A, while FIG. 9B shows a plot of the intensity profile of FIG. 9A. In both cases, it can be seen that the central hole 25 of the laser beam 2' evident in FIG. 3A is not present in the laser beam 2 after reflection by a reflector 32 arranged in accordance with either FIGS. 5A, 5B. Removal of the central hole 25 in the intensity profile allows the intensity of the laser beam 2 to be greater than a threshold intensity over substantially the whole cross-section of the fuel target (where the cross-section of the fuel target is taken in a plane that lie perpendicular to the direction of propagation of the laser beam 2). The threshold intensity may, for example, be an intensity that causes the fuel to be excited to form an EUV emitting plasma and thus substantially the whole cross-section of the fuel target may be excited to form a plasma.

While four orientations are described above, it is to be understood that any number of orientations may be provided. The number of orientations, and the number and shape of the individual facets within the reflector 32 may be selected to obtain a generally consistent intensity profile at the plasma formation region 4.

Comparing the radiation source SO of FIG. 4 with the radiation source SO' of FIG. 2, it is the reflector 22 of FIG. 2 that is replaced with the faceted reflector 32. It is to be understood, however, that in other embodiments, a facetted reflector may be placed at different positions within the laser beam directing apparatus of the radiation source SO. For example, the reflector 20 may be replaced with a faceted reflector. Additionally, the directing apparatus of the radiation source SO may comprise other optical components, including other reflectors, not depicted in FIG. 3. A faceted reflector may therefore be placed at any location in the path of the laser beam 2 to the plasma formation region 4.

Figure 10:
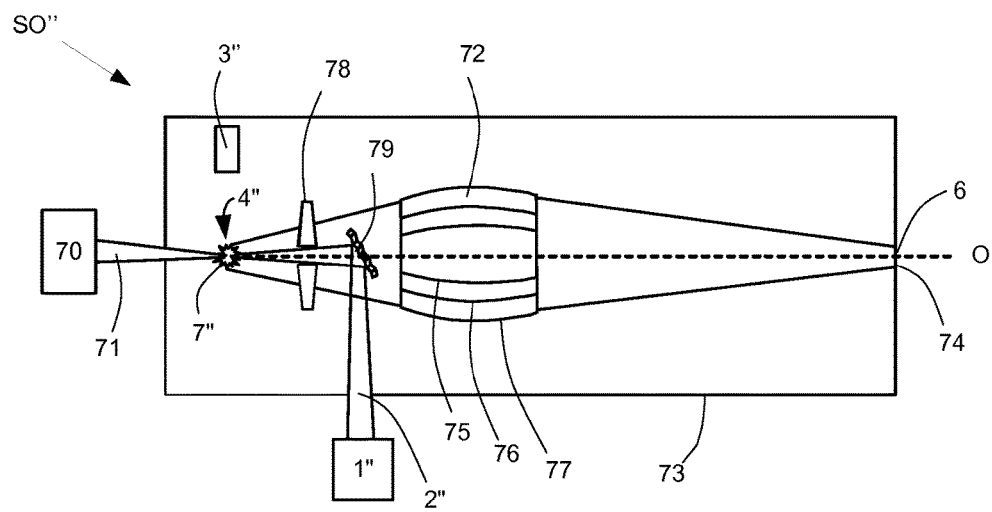
FIG. 10 schematically depicts a radiation source according to an alternative embodiment of the invention.

Further, in other embodiments, the radiation source SO may be arranged differently to the arrangement shown in FIG. 4. FIG. 10 shows a laser produced plasma (LPP) radiation source SO" that has an alternative configuration to the radiation source shown in FIG. 4. The radiation source SO" includes a fuel emitter 3" that is configured to deliver fuel to a plasma formation region 4". A pre-pulse laser 70 emits a pre-pulse laser beam 71 that is incident upon the fuel. As described above, the pre-pulse laser beam 71 acts to preheat the fuel, thereby changing a property of the fuel such as its size and/or shape. A main laser 1" emits a main laser beam 2" that is incident upon the fuel after the pre-pulse laser beam 71. The main laser beam 2" delivers energy to the fuel and thereby coverts the fuel into an EUV radiation emitting plasma 7".

A radiation collector 72, which may be a so-called grazing incidence collector, is configured to collect the EUV radiation and focus the EUV radiation at a point 6 that may be referred to as the intermediate focus. Thus, an image of the radiation emitting plasma 7" is formed at the intermediate focus 6. An enclosure structure 73 of the radiation source SO includes an opening 74 that is at or near to the intermediate focus 6. The EUV radiation passes through the opening 74 to an illumination system of a lithographic apparatus (e.g., of the form shown schematically in FIG. 1).

The radiation collector 72 may be a nested collector, with a plurality of grazing incidence reflectors 75, 76 and 77 (e.g., as schematically depicted). The grazing incidence reflectors 75, 76 and 77 may be disposed axially symmetrically around an optical axis O. The illustrated radiation collector 72 is shown merely as an example, and other radiation collectors may be used.

A contamination trap 78 is located between the plasma formation region 4" and the radiation collector 72. The contamination trap 78 may for example be a rotating foil trap, or may be any other suitable form of contamination trap. In some embodiments the contamination trap 78 may be omitted.

The enclosure 73 of the radiation source SO may include a window through which the pre-pulse laser beam 71 can pass to the plasma formation region 4", and a window through which the main laser beam 2" can pass to the plasma formation region 4". A facetted reflector 79 acts, as described above with reference to the facetted reflector 32 in the embodiment of FIG. 4, to direct the main laser beam 71 through an opening in the contamination trap 78 to the plasma formation region 4".

Each of the radiation sources SO, SO" shown in FIGS. 4 and 10 may include components that are not illustrated. For example, a spectral filter may be provided in the radiation source. The spectral filter may be substantially transmissive for EUV radiation but substantially blocking for other wavelengths of radiation such as infrared radiation.

One or more of reflectors within a beam directing apparatus of a radiation source may be provided with actuators to change the orientation and/or position of the reflectors with respect to the laser beam 2. The actuator(s) may also alter any appropriate property of the reflector that will alter the focus position of the laser beam 2. For example, actuator(s) may be provided to change the shape of a reflector. For example, with reference to FIG. 4, one or more facets of the faceted reflector 32 may be provided with actuators (not shown) operable to adjust an orientation of those facets. The actuators may be connected to a controller (not shown) operable to receive information regarding a property of the laser beam 2 at one or more positions along the beam path. For example, sensors (not shown) may be provided along the path of the laser beam 2 between the laser 1 and the plasma formation region, the sensors operable to determine a property of the laser beam 2 and to provide that information to a controller. The controller may then control actuators to alter the facetted reflector 32, or one or more facets of the facetted reflector 32.

The facets themselves may be made from a flexible material, such that the shape of the individual facets may be altered by appropriate actuators in order to adjust a property of the initiating radiation beam 2 at the plasma formation region 4.

The fuel target may be reflective, resulting in a portion of the laser beam 2 that is incident on the fuel target being reflected back towards the beam distribution apparatus and the laser 1. Such reflections may detrimentally re-enter the laser 1 and interact with an optical gain medium provided within the laser 1 (known as parasitic lasing). The laser 1 may be provided with spatial filters (not shown) to mitigate the effect of reflected laser beams. Providing a faceted reflector in the path of the laser beam 2 between the laser 1 and the plasma formation region comprising a subset of facets directing laser radiation in one direction, and a subset of facets directing laser radiation in a second direction (as in the example embodiments shown in FIGS. 4 and 10), laser beams reflected from a fuel target will interact with the faceted reflector in the reverse path. In this way, the reflected beam is defocused before reaching the laser 1. Spatial filters provided at the laser 1 will be more effective for reflected beams having a less well-defined focus. The provision of a faceted reflector therefore provides further advantages by reducing energy drain within the laser 1.

Figure 11A:
FIGS. 11A-11C schematically depict connections between facets of a facetted reflector.

Undesired return reflection of laser radiation may also occur from the faceted reflector 32. In particular, it has been realised that reflection of laser radiation from the faceted reflector 32 may occur at the boundaries between the facets of the faceted reflector 32. It has therefore been realised that, counter-intuitively, the faceted reflector 32 may advantageously be arranged so as to reduce the incidence of sharp transitions between the facets. An example of sharp transitions, (or stepped transitions), is illustrated in FIG. 11A, which illustrates a connecting portion 80 between the X and Y facets shown in FIG. 6A. The connecting portion 80 extends entirely in the y-z plane (with reference to the spatial axes depicted in FIG. 11A) without any tilt in the z-direction. It has been determined that a sharp transition may result in undesired return reflection towards the laser 1.

Figure 11B:
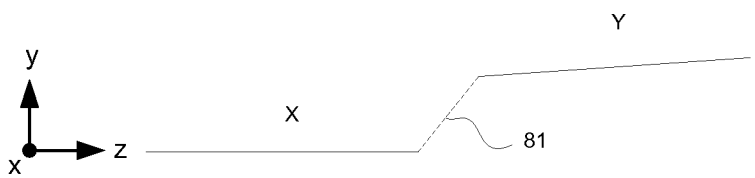
Figure 11C:
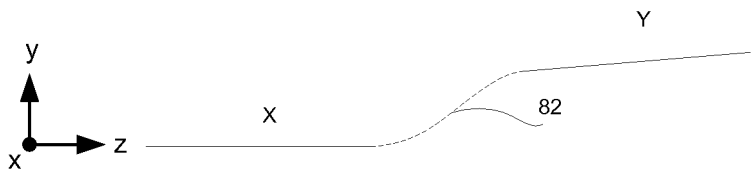

FIGS. 11B, 11C, illustrate examples of alternative arrangements of transitions between the facets. In particular, FIGS. 11B and 11C show alternative, soft, or gradual, transitions between the X and Y facets. In FIG. 11B a gradual transition is provided by a connecting portion 81. The connecting portion 81 is substantially flat but is tilted in the z-direction. In FIG. 11C a shallow S-shaped transition 82 extends between the X and Y facets and is also tilted in the z-direction. It is to be understood that the examples of FIGS. 11B, 11C are merely exemplary and that other transitions may be used.

Figure 12:
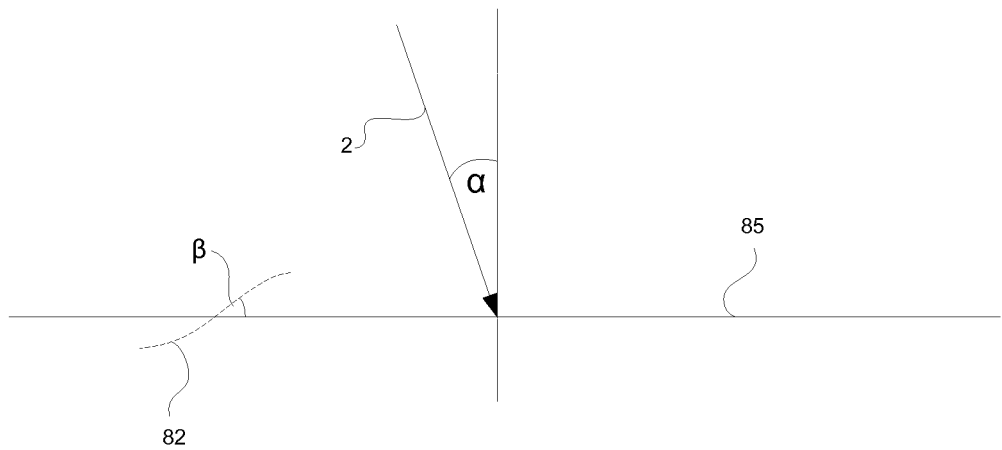
FIG. 12 schematically depicts a connection between a facet of a facetted reflector in relation to an average plane defined by the faceted reflector.

To reduce undesirable reflection from the faceted reflector 32 back towards the laser 1, transitions between facets may be arranged at angles to an average plane of the reflector 32 that do not exceed the angle of incidence of the laser beam 2 with respect to the average plane defined by the faceted reflector 32. Referring to FIG. 12, an average plane 85 defined by the surfaces of the facets that receive the laser beam 2, is shown. An angle of incidence α between the laser beam 2 and the average plane 85 is depicted, as is a maximum angle β between the average plane 85 and the connecting portion 82 of FIG. 11C. Generally, to reduce undesirable reflection back towards the laser 1, connecting portions between the facets of the reflector 32 may be arranged such that an angle β between any point along the connecting surface and the average plane 85 is smaller than the angle α.

While the transitions, or connecting portions, between facets may be reflective (or may not be reflective), they do not form part of the reflective surface of the facets. In particular, the connecting portions are not arranged to direct radiation in the particular direction of particular subsets. For example, a reflective surface of a first facet belonging to a first subset may be arranged to direct radiation in a first direction, and a reflective surface of a second facet belonging to a second subset may be arranged to direct radiation in a second direction. The first and second facets may be connected by a connecting portion. While the connecting portion may be reflective, it is not arranged to direct radiation in the first or second direction and as such does not form part of the reflective surface of either of the first or second facets.

The number, shape, location and orientation of the facets may be determined with reference to known properties of the laser beam 2. For example, wave propagation algorithms may be used to model the propagation of the laser beam 2 and facet properties determined in dependence upon desired properties of the laser beam 2 at the plasma formation region 4.

While each of the above descriptions is directed to use of a faceted reflectors within a radiation source, faceted reflectors of the type described above may be used more generally. For example, a faceted reflector of the type described above may be used within other components of a lithographic apparatus, such as within the illuminator IL of the lithographic apparatus schematically illustrated in FIG. 1. More generally still, faceted reflectors of the type described above may be used in any application in which it is desired to direct a radiation beam, such as a laser beam, to increase homogeneity of intensity within the radiation beam, or to increase a minimum intensity of the radiation beam.

Figure 13:
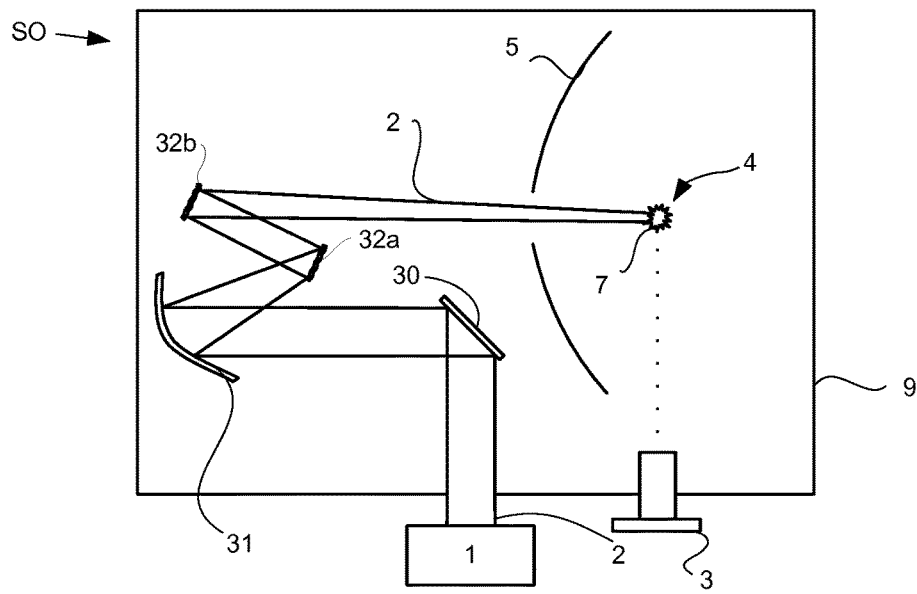
FIG. 13 schematically depicts a radiation source according to an alternative embodiment of the invention.

Embodiments of a beam directing apparatus have been described above in which include a single faceted reflector 32, however in some embodiments more than one faceted reflector may be used as part of a beam directing apparatus. FIG. 13 illustrates an embodiment of a radiation source SO that includes a beam directing apparatus comprising two faceted reflectors 32a and 32b. Like the radiation source SO depicted in FIG. 4, the beam directing apparatus acts to direct and focus the laser beam 2 towards the plasma formation region 4. The beam directing apparatus includes reflectors 30, 31 that each comprise a single substantially continuous (i.e., smooth or unbroken) reflective surface. The beam directing apparatus further comprises two faceted reflectors 32a and 32b that each comprise a plurality of individual facets. Each facet of the faceted reflectors 32a, 32b is tilted with respect to the surface of at least another one of the facets of the faceted reflectors 32a, 32b so that portions of the laser beam 2 are reflected in different directions.

The facetted reflector 32a may be a field facet mirror and the faceted reflector 32b may be a pupil facet mirror. That is the field facet mirror 32a may be positioned in a field plane of the beam directing apparatus and the pupil facet mirror 32b may be positioned in a pupil plane of the beam directing apparatus. The orientation of the individual facets of the field facet mirror 32a and the pupil facet mirror 32b may be controlled in order to control the cross-sectional shape and/or the angular distribution of the laser beam 2 that is incident on the fuel target at the plasma formation region 4. In this respect the field facet mirror 32a and the pupil facet mirror 32b may be similar to the faceted field mirror device 10 and the faceted pupil mirror device 11 of the illumination system IL that together provide an EUV radiation beam B with a desired cross-sectional shape and a desired angular distribution.

Figures 14A, 14B:
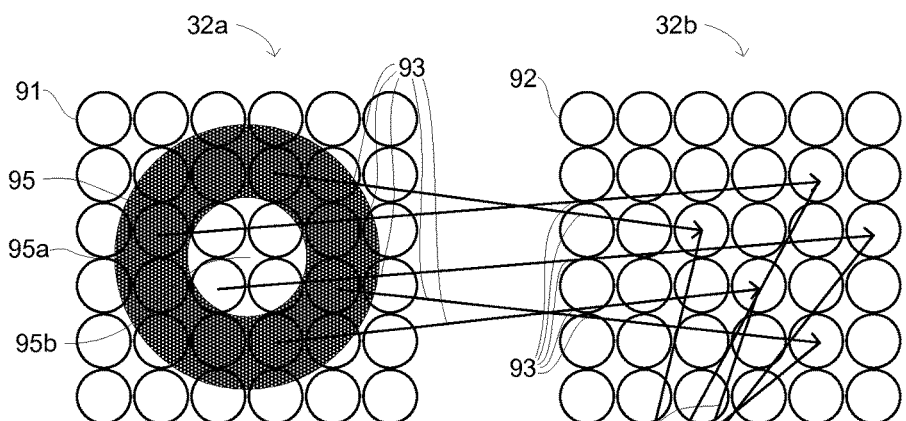
FIG. 14A-14C schematically depict facetted reflectors and an intensity profile of a radiation beam at a fuel target of the radiation source of FIG. 13.

FIG. 14A is a schematic illustration of the field facet mirror 32a. The field facet mirror 32a comprises a plurality of reflective field facets 91. Whilst the field facet mirror 32a is shown in FIG. 14A as comprising 36 substantially circular reflective field facets 91, the field facet mirror 32a may comprise many more field facets 91 than are shown in FIG. 14A and the field facets 91 may be shaped differently than is shown in FIG. 14A. For example, the field facets 91 of the field facet mirror 32a may comprise reflective surfaces that are substantially rectangular. Alternatively the field facets 91 may comprise reflective surfaces that have curved edges. In general field facets 91 of any shape may be used.

It will be appreciated from the discussion above of the intensity profile of a cross section of the laser beam 2 that the laser beam 2 that is incident on the field facet mirror 32a may have a substantially non-uniform intensity profile in its cross section. This is depicted schematically in FIG. 14A in which an intensity profile 95 of a laser beam 2 is shown as being incident on the field facet mirror 32a. The intensity profile 95 comprises an outer portion 95a of relatively high intensity and an inner portion 95b of relatively low, near zero intensity. The intensity of laser radiation that is incident on the field facets 91 of the field facet mirror 32a may therefore be different for different field facets 91. For example, field facets 91 of the field facet mirror 32a on which the outer high intensity portion 95a of the laser beam 2 is incident may receive significantly more radiation than field facets 91 on which the inner low intensity portion 95b of the laser beam 2 is incident.

Each facet 91 of the field facet mirror 32a may be arranged such that it reflects a portion of the intensity profile 95 of the laser beam 2 to be incident on a single facet of the pupil facet mirror 32b. The field facet mirror 32a therefore acts to image portions of the intensity profile 95 that are incident on a field plane onto different facets of the pupil facet mirror 32*b* that lies in a pupil plane. FIG. 14B is a schematic illustration of the pupil facet mirror 32*b* that comprises a plurality of reflective pupil facets 92. Whilst the pupil facet mirror 32*b* is shown in FIG. 14B as comprising 36 substantially circular reflective pupil facets 92, the pupil facet mirror 32*b* may comprise many more pupil facets 92 than are shown in FIG. 14B and the pupil facets 92 may be shaped differently than is shown in FIG. 14B.

The imaging of the intensity profile 95 in the field plane onto pupil facets 92 in the pupil plane is depicted by arrows 93 that extend between FIGS. 14A and 14B. For ease of illustration arrows 93 are only depicted for some of the field facets 91 and the pupil facets 92, however in practice each field facet 91 may image a portion of the intensity profile 95 onto a respective pupil facet 92. The field facets 91 may be orientated such that portions of the intensity profile 95 in the field plane are redistributed in the pupil plane such that an intensity profile of radiation that is incident on the pupil facet mirror 32*b* is different to the intensity profile 95 that is incident on the field facet mirror 32*a* in the field plane.

Figure 14C:
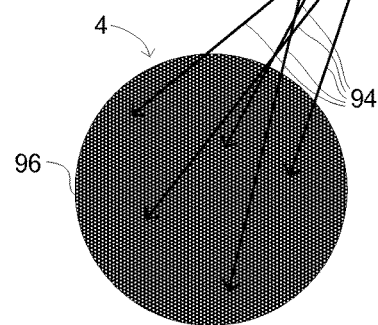

The pupil facets 92 are orientated such that the portions of the intensity profile 95 that are incident on the pupil facets 92 are imaged into an object plane at the plasma formation region 4. FIG. 14C schematically illustrates an intensity profile 96 in the object plane at the plasma formation region 4. FIG. 14C represents the intensity profile that is incident on a fuel target in the radiation source SO. The imaging of radiation from the pupil facets 92 in the pupil plane to the object plane at the plasma formation region 4 is depicted by arrows 94 that extend between FIGS. 14B and 14C.

The orientation of the field facets 91 and the pupil facets 92 may be such that the homogeneity of the intensity profile 96 in the object plane at the plasma formation region 4 is increased when compared to the homogeneity of the intensity profile 95 that is incident on the field facet mirror 32*a* in the field plane. For example some portions of the intensity profile 95 that lie in the outer high intensity portion 95*a* in the field plane may be imaged into a central region of the intensity profile 96 in the object plane. This may serve to increase the intensity in the central region of the intensity profile 96 in the object plane when compared to the inner low intensity portion 95*b* of the intensity profile 95 in the field plane.

The orientation of the field facets 91 and the pupil facets 92 may serve to image the cross-sectional intensity profile 95 of the laser beam 2 from the field plane to the object plane such that the intensity of radiation that is incident on a fuel target at the plasma formation region 4 in the object plane is greater than a threshold intensity over substantially the whole cross-section of the fuel target. The threshold intensity may, for example, be an intensity that causes the fuel to be excited to form an EUV emitting plasma and thus the orientation of the field facets 91 and the pupil facets 92 may serve to ensure that substantially the whole cross-section of the fuel target is excited to form a plasma.

The orientation of the field facets 91 and the orientation of the pupil facets 92 may be adjustable and may be controlled in order to form a desired intensity profile 96 in the object plane at the plasma formation region 4. For example, one or more actuators may be operable to adjust the orientation of the field facets 91 and the pupil facets 92. The orientation of the field facets 91 and the pupil facets 92 may, for example, be controlled in response to one or more measurements of the laser beam 2. The one or more measurements of the laser beam 2 may, for example, be made in the field plane. For example, one or more sensors may be positioned at or near to the field facet mirror 32*a*. Additionally or alternatively one or more sensors may be positioned at other locations along the path of the laser beam 2.

In an embodiment one or more wavefront sensors (not shown) may be positioned in between facets of the field facet mirror 32*a*. The wavefront sensors may serve to measure the intensity profile and/or wavefront aberrations of the laser beam 2 in the field plane. Measurements from the one or more wavefront sensors may, for example, be input to a controller (not shown) that may control the orientation of the field facets 91 and/or the orientation of the pupil facets 92. The controller may use measurements from the wavefront sensors to determine an orientation of the field facets 91 and the pupil facets 92 that causes a desired intensity profile of the laser beam 2 at the plasma formation region 4. The controller may control actuators that are configured to adjust the orientation of the field facets 91 and the pupil facets 92 such that a desired orientation of the field facets 91 and the pupil facets 92 may be brought about.

In an embodiment the wavefront sensors may comprise a plurality of apertures at known positions in the field facet mirror 32*a*. The apertures may be positioned in the field facets 91 and/or they may be positioned between field facets 91. The position and/or the intensity of radiation that propagates through the apertures may be measured (e.g., by a CCD array) at a position behind the field facet mirror 32*a*. Such measurements may be used to determine one or more properties of the laser beam 2 that is incident on the field facet mirror 32*a*. For example, the divergence of the laser beam 2 may be determined, wavefront aberrations in the laser beam 2 may be determined and/or the intensity profile of the laser beam 2 may be determined.

In some embodiments a beam splitter may be positioned in the path of the laser beam 2. The beam splitter that may, for example, comprise a partially reflective mirror, may be configured to direct a portion of the laser beam 2 towards one or more sensors and may be configured to transmit a remainder of the laser beam 2. The one or more sensors may, for example, comprise a wavefront sensor.

The laser beam 2 that is incident on the reflectors 30, 31, 32*a* and 32*b* of the beam delivery apparatus may heat one or more of the reflectors 30, 31, 32*a*, 32*b*. Heating of the reflectors may cause regions of the reflectors to expand that may serve to change the optical properties of the reflectors. A change in the optical properties of one or more of the reflectors 30, 31, 32*a*, 32*b* may change the shape and/or the intensity profile of the laser beam 2 that is incident on the fuel target at the plasma formation location 4. The orientation of the field facets 91 and the pupil facets 92 may be controlled in anticipation of or in response to a change in the optical properties of one or more of the reflectors of the beam directing apparatus so as to compensate for the change in optical properties. For example, a controller may use one or more measurements of the laser beam 2 to predict a change in optical properties that may be brought about by heating of the reflectors of the beam directing apparatus. The controller may calculate a change in the orientation of the field facets 91 and/or the pupil facets 92 that can compensate for any such heating of the reflectors and may drive actuators to change the orientation of the field facets 91 and the pupil facets 92 accordingly. Additionally or alternatively one or more measurements of the laser beam 2 may be used in a feedback mechanism in order to compensate for heating of reflectors of the beam directing apparatus.

In some embodiments the temperature of the field facet mirror 32*a* and/or the temperature of the pupil facet mirror 32*b* may be measured. For example, one or more temperature sensors may be positioned in between the field facets 91 and/or the pupil facets 92 or may be placed in thermal contact with the field facets 91 and/or the pupil facets 92. In some embodiments the temperature of the field facets 91 and/or the pupil facets 92 may be measured by measuring the temperature of a coolant (e.g., water) that is used to cool the field facets 91 and/or the pupil facets 92.

Measurements of the temperature of the field facet mirror 32a and/or the pupil facet mirror 32b may, for example, be used to determine a thermal load that is placed on the field facet mirror 32a and/or the pupil facet mirror 32b. The thermal load may be used to determine an intensity profile of radiation that is incident on the field facet mirror 32a and/or on the pupil facet mirror 32b. Such measurements of the intensity profile of the laser beam 2 may be used instead of or in addition to measurements made by one or more wavefront sensors.

In some embodiments the power of the laser beam 2 may be reduced or the laser beam 2 may be turned off at times during which the orientation of the field facets 91 and the pupil facets 92 is being adjusted. This may reduce the intensity of radiation from the laser beam 2 that is directed to locations in the radiation source SO other than the plasma formation region 4. For example, during an adjustment of the orientation of the field facets 91 and the pupil facets 92 radiation from the laser beam 2 may temporarily be directed away from the plasma formation region 4. This may be undesirable as radiation from the laser beam 2 may instead be incident on other components of the radiation source SO that may cause undesirable heating of and/or damage to the components. Any heating and/or damage may be reduced by reducing the power of the laser beam 2 during an adjustment of the orientation of the field facets 91 and the pupil facets 92. For example, the laser 1 may initially be at a high power setting, the laser beam 2 may be measured and a desired adjustment of the field facets 91 and the pupil facets 92 may be determined. The power of the laser beam 2 may then be reduced whilst the desired adjustment of the field facets 91 and the pupil facets 92 takes place. The power of the laser beam 2 may then be increased again and the intensity profile of the laser beam 2 may be measured again.

Additionally or alternatively one or more screens may be positioned downstream of the pupil facet mirror 32b. One or more apertures may be provided within the screens to allow radiation that is directed from the pupil facet mirror 32b and towards the plasma formation region 4 to pass through the apertures but cause radiation that is directed towards other locations within the radiation source SO to be blocked.

Additionally or alternatively adjustments to the orientation of the field facets 91 and the pupil facets 92 may be controlled such that radiation from the laser beam 2 is not directed to locations in the radiation source SO that may cause heating of and/or to damage to sensitive components of the radiation source SO.

Whilst the use of a field facet mirror 32a and a pupil facet mirror 32b has been described in the context of a specific embodiment of a beam directing apparatus as shown in FIG. 13 it will be appreciated that a field facet mirror 32a and a pupil facet mirror 32b may be used in other forms of a beam directing apparatus. For example, the reflectors of the beam directing apparatus of FIG. 13 may be arranged other than is shown in FIG. 13. A beam directing apparatus including a field facet mirror 32a and a pupil facet mirror 32b may include more or fewer reflectors than are shown in FIG. 13 and may include different reflectors to those which are shown in FIG. 13. A beam directing apparatus comprising a field facet mirror 32a and a pupil facet mirror 32b may be used with other forms of radiation source than the radiation source SO that is depicted in FIG. 13. For example, a beam directing apparatus comprising a field facet mirror 32a and a pupil facet mirror 32b may be used in a radiation source SO of the type that is depicted in FIG. 10.

Embodiments of a beam directing apparatus have been described above as comprising one or more faceted reflectors 32. However, in some embodiments an optical element other than a facetted reflector 32 may be used to increase a fraction of the cross-section of the laser beam 2 over which the intensity of the laser beam 2 is greater than a threshold intensity. For example, a beam directing apparatus may include a deformable mirror comprising a reflective surface whose shape can be adapted in order to alter the reflective properties of the mirror and in order to change an intensity profile of a laser beam 2 that is reflected from the deformable mirror. A reflective surface of a deformable mirror may, for example, be disposed on a flexible substrate. The deformable mirror may comprise one or more actuators that are configured to adjust the shape of the flexible substrate thereby adjusting the shape of the reflective surface.

Figure 15:
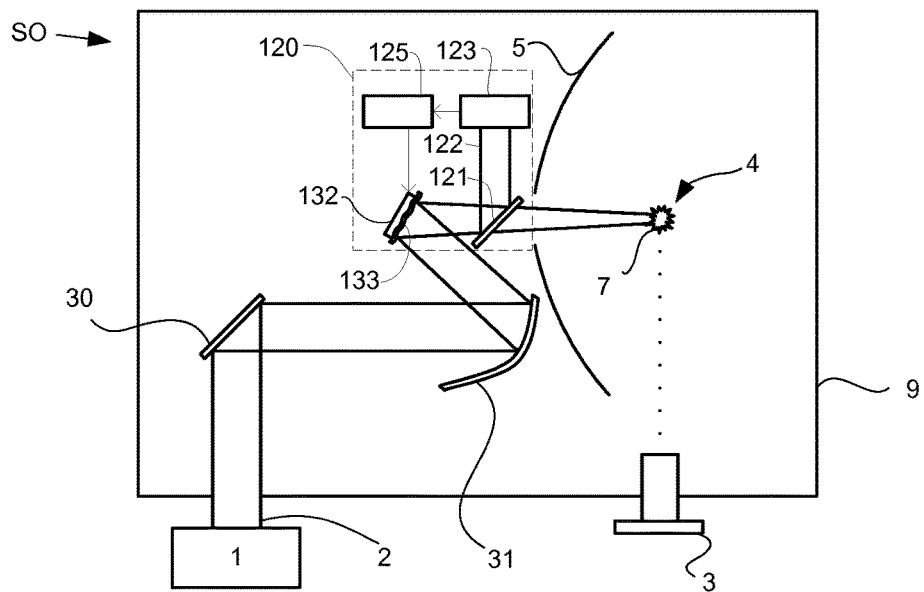
FIG. 15 schematically depicts a radiation source according to an alternative embodiment of the invention.

FIG. 15 is a schematic illustration of a radiation source SO that includes a beam delivery apparatus comprising a deformable mirror 132. The deformable mirror 132 includes a reflective surface 133 whose shape may be adapted. The shape of the reflective surface 133 may, for example, be adapted in order to correct wavefront aberrations that may be introduced to the laser beam 2. For example, the reflector 30 and/or the reflector 31 from which the laser beam 2 is reflected before reaching the deformable mirror 132 may include optical aberrations. Additionally or alternatively optical elements of a beam delivery system (not shown) that may be used to deliver the laser beam 2 to the radiation source from a laser 1 may include optical aberrations. Optical aberrations in a beam directing apparatus and/or a beam delivery system may introduce wavefront aberrations to the laser beam 2. As was explained above wavefront aberrations in the laser beam 2 may be one of the causes of a non-uniform intensity profile of the laser beam 2 in its cross-section (e.g., a low intensity inner portion of the laser beam 2 may be caused by wavefront aberrations in the laser beam 2). It may therefore be desirable to adjust the shape of the reflective surface 133 of the deformable mirror 132 in order to correct wavefront aberrations in the laser beam 2.

Wavefront aberations in the laser beam 2 may, for example, be corrected by an adaptive optics system 120 that includes the deformable mirror 132. The adaptive optics system 120 further comprises a beam splitter 121, a wavefront sensor 123 and a controller 125. The beam splitter 121 is configured to direct a portion 122 of the laser beam 2 to be incident on the wavefront sensor 123. The beam splitter 121 may, for example, comprise a partially reflective mirror. The wavefront sensor 123 is configured to measure wavefront aberrations in the portion 122 of the laser beam 2 and may therefore be used to determine wavefront aberrations in the laser beam 2. Measurements of wavefront aberrations in the portion 122 of the laser beam 2 are output from the wavefront sensor 123 and input to the controller 125. The controller 125 controls the deformable mirror 132 in response to the measurements that are received from the wavefront sensor 123. The controller 125 is operable to adapt the shape of the reflective surface 133 of the deformable mirror 132 so as to correct wavefront aberrations in the laser beam 2 that are measured by the wavefront sensor 123.

Correcting wavefront aberrations in the laser beam 2 using the adaptive optics system 120 may increase the homogeneity of the intensity profile of the laser beam 2. For example, the intensity in a central region of the intensity profile of the laser beam 2 may be increased be the adaptive optics system 120.

The adaptive optics system 120 may serve to correct wavefront aberrations in the laser beam 2 such that the intensity of radiation that is incident on a fuel target at the plasma formation region 4 is greater than a threshold intensity over substantially the whole cross-section of the fuel target. The threshold intensity may, for example, be an intensity that causes the fuel to be excited to form an EUV emitting plasma and thus the adaptive optics system 120 may serve to ensure that substantially the whole cross-section of the fuel target is excited to form a plasma.

Whilst the use of an adaptive optics system 120 has been described in the context of a specific embodiment of a beam directing apparatus as shown in FIG. 15 it will be appreciated that an adaptive optics system 120 may be used in other forms of a beam directing apparatus. For example, the reflectors of the beam directing apparatus of FIG. 15 may be arranged other than is shown in FIG. 15. A beam directing apparatus including an adaptive optics system 120 may include more or fewer reflectors than are shown in FIG. 15 and may include different reflectors to those which are shown in FIG. 15. A beam directing apparatus comprising an adaptive optics system 120 may be used with other forms of radiation source than the radiation source SO that is depicted in FIG. 15. For example, a beam directing apparatus comprising an adaptive optics system 120 may be used in a radiation source SO of the type that is depicted in FIG. 10.

Figure 16:
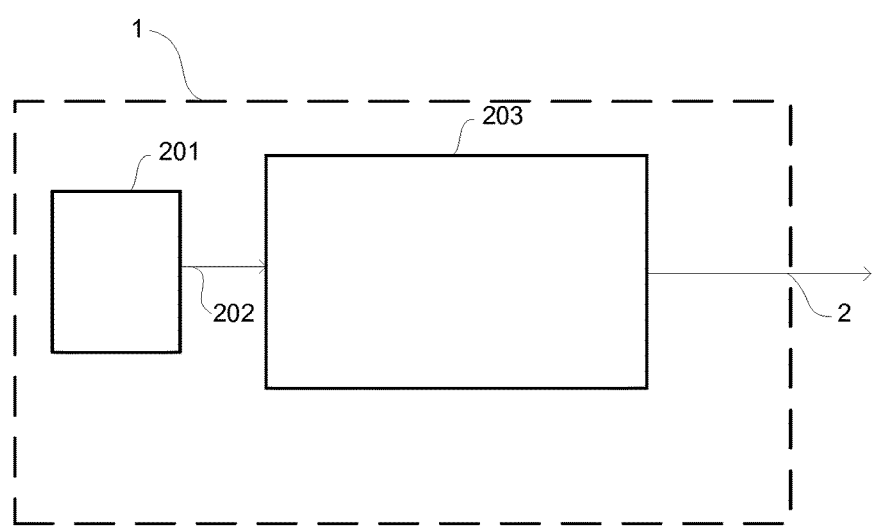
FIG. 16 schematically depicts a laser that may be used to provide a laser beam to any of the radiation sources of FIG. 4, 10, 13 or 15.

Embodiments have been described above in which the fraction of the cross-section of the laser beam 2 over which the intensity of the laser beam 2 is greater than a threshold intensity is increased by positioning one or more optical elements (e.g., a facetted reflector 32, a field facet mirror 32a, a pupil facet mirror 32b and/or a deformable mirror 132) in the path of the laser beam 2. In addition to or as an alternative to the use of such optical elements, the fraction of the cross-section of the laser beam 2 over which the intensity of the laser beam 2 is greater than a threshold intensity may be increased by reducing the coherence of the laser beam 2. For example an incoherent laser beam 2 may be provided to a radiation source SO. As was described above, inhomogeneity in the intensity profile of the laser beam 2 may be caused by interference in the laser beam 2 that is brought about by wavefront aberrations in the laser beam 2. Interference effects in the laser beam 2 occur when the laser beam 2 is coherent. Reducing the coherence of the laser beam 2 therefore reduces interference effects in the laser beam 2, reduces the sensitivity of the intensity profile of the laser beam 2 to optical aberrations in the beam directing apparatus and/or in a beam delivery system, and therefore increase the homogeneity of the intensity profile of the laser beam 2. FIG. 16 is a schematic illustration of a laser 1 according to an example embodiment that may provide the laser beam 2 to a radiation source SO. The laser 1 comprises a seed laser 201 and an amplification chain 203. The seed laser 201 may be referred to as a master oscillator and the configuration of the laser 1 may be referred to as a Master Oscillator Power Amplifier (MOPA) configuration. The seed laser 201 may, for example, be a gas discharge laser such as a CO2 laser. The seed laser 201 emits a seed laser beam 202 that is input to the amplification chain 203. The amplification chain 203 comprises one or more optical amplifiers. An optical amplifier may, for example, comprise a gas (e.g., CO2) that is pumped by electric discharge (e.g., radio frequency discharge). The amplification chain 203 amplifies the seed laser 202 and emits the laser beam 2 that is delivered to the radiation source SO.

The seed laser 201 may operate in a single transverse mode (e.g., a fundamental transverse mode TM00). In this case the laser beam 2 may have a high level of temporal and spatial coherence. As was explained above a high level of coherence may mean that optical aberrations in optical elements that are used to direct the laser beam 2 cause the laser beam 2 to have an inhomogeneous intensity profile in its cross-section. The coherence of the laser beam 2 may be reduced, for example, by operating the seed laser 201 in multiple modes. For example, the seed laser 201 may be operated in multiple transverse and longitudinal modes to reduce the spatial and temporal coherence of the laser beam 2. In this case the laser beam 2 may be considered to be an incoherent laser beam 2.

The coherence of the laser beam 2 may be further reduced by increasing the bandwidth of the laser beam 2. The bandwidth of the laser beam 2 may, for example, be increased by stimulating different transitions between energy levels in a gain medium of the seed laser 201 and a gain medium of the amplification chain 203. For example, in a narrow bandwidth mode of operation a single energy level transition may be stimulated in the gain media of the laser 1. However the bandwidth of the laser beam 2 may be increased by stimulating more than one energy level transitions in the gain media such that radiation of different wavelengths is emitted.

Reducing the coherence of the laser beam 2 may increase the cross-section of the laser beam 2 at a focus of the laser beam 2 in the radiation source SO. In an embodiment in which the laser beam 2 is coherent, the fuel emitter 3 may emit and direct the fuel such that the laser beam 2 is incident on the fuel target at a plasma formation region 4 at which the laser beam 2 is not in focus. This may ensure that the cross-sectional area of the laser beam 2 is greater than or equal to the cross-sectional area of the fuel target at the plasma formation region 4. However in an embodiment in which the coherence of the laser beam 2 is reduced, the cross-sectional area of the laser beam 2, at a position of maximum focus of the laser beam 2, may be increased such that the cross-section of the laser beam 2 at the focus is greater than or equal to the cross-section of the fuel target. Reducing the coherence of the laser beam 2 therefore allows the fuel emitter 3 and the beam directing apparatus to be arranged such that the laser beam 2 is incident on the fuel target at a plasma formation region 4 at which the laser beam 2 is in focus, whilst still ensuring that the cross-section of the laser beam 2 is greater than or equal to the cross-section of the fuel target at the plasma formation region 4.

The seed laser may be controlled in order to control the coherence of the laser beam 2. The coherence of the laser beam 2 may be controlled such that the laser beam 2 has a desired cross-sectional area at the plasma formation region 4. The coherence of the laser beam 2 may further be controlled such that the laser beam 2 has a desired intensity profile in its cross-section at the plasma formation region 4.

In some embodiments the coherence of the laser beam 2 may be reduced as was described above in addition to using at least one optical element (e.g., a facetted reflector 32, a field facet mirror 32a, a pupil facet mirror 32b and/or a deformable mirror 132) configured to increase a fraction of the cross-section of the laser beam 2 over which the intensity of the laser beam 2 is greater than a threshold intensity. In some alternative embodiments the coherence of the laser beam 2 may be reduced instead of using one or more optical components configured to increase a fraction of the cross-section of the laser beam 2 over which the intensity of the laser beam 2 is greater than a threshold intensity.

Methods and apparatus have been described above in which the intensity profile of a main-pulse laser beam is discussed. However the methods and apparatus may additionally or alternatively be used to control the intensity profile of a pre-pulse laser beam. A pre-pulse laser beam may be directed to be incident on a fuel target before the main-pulse laser beam 2 is incident on the fuel target. The pre-pulse laser beam may act to change the shape of the fuel target so that the fuel target is in a desired shape when it reaches the plasma formation region 4. In such embodiments the pre-pulse laser beam may be considered to be an example of an initiating radiation beam as it initiates a plasma formation process.

In some embodiments a pre-pulse laser beam may be provided by the same laser 1 from which the main-pulse laser beam 2 is provided. In such embodiments the same beam directing apparatus may be used to direct the pre-pulse laser beam to be incident on the fuel target as is used to direct the main-pulse laser beam 2 to be incident on the fuel target.

Alternatively a pre-pulse laser beam may be provided from a laser that is different to the laser 1 that provides the main-pulse laser beam 2. In such embodiments a separate beam directing apparatus may be used to direct the pre-pulse laser beam to be incident on the fuel target as is used to direct the main-pulse laser beam 2 to be incident on the fuel target. A beam directing apparatus that is used to direct a pre-pulse laser beam may include any of the features of any of the embodiments of a beam directing apparatus that are described above.

In an embodiment in which a beam apparatus is provided to direct a pre-pulse laser beam to be incident on a fuel target such that the intensity of the pre-pulse laser beam is greater than a threshold intensity over substantially the whole cross-section of the fuel target, the threshold intensity may, for example, be an intensity that acts to change the shape of the fuel target to a desired shape.

Embodiments of radiation sources have been described above in which a laser produced plasma is formed in a laser produce plasma (LPP) radiation source. However a plasma may alternatively be produced in a radiation source by initiating an electric discharge in a fuel. A radiation source in which a plasma is produce by electrical discharge may be referred to as a discharge produce plasma (DPP) radiation source.

A DPP radiation source may comprise at least two electrodes. At least one electrode of a DPP radiation source may be provided with a fuel (e.g., tin), for example on a surface of the electrode. The fuel may be emitted from the electrode by directing an initiating radiation beam to be incident on the fuel on the electrode. The electrode may, for example, rotate so as to bring the fuel into the path of the initiating radiation beam and provide a fuel target on which the initiating radiation beam is incident. The electrode may therefore be considered to be an example of a fuel emitter that is configured to provide a fuel and direct the fuel so as to provide a fuel target.

The initiating radiation beam may cause fuel to be emitted from the electrode by ablation. Ablation of the fuel from the electrode may form a cloud of fuel between the electrodes. An electric discharge may be initiated between the electrodes. The electric discharge may excite the fuel cloud to form a plasma that emits radiation (e.g., EUV radiation).

In an embodiment in which the radiation source is a DPP radiation source, the DPP radiation source may comprise a beam apparatus configured to direct an initiating radiation beam to be incident on the fuel target such that the intensity of the initiating radiation beam is greater than a threshold intensity over substantially the whole cross-section of the fuel target. The beam apparatus of a DPP radiation source may include any of the features of any of the embodiments of a beam apparatus that were described above in relation to embodiments of an LPP radiation source. The threshold intensity may, for example, be an intensity that causes ablation of fuel from within the fuel target on an electrode of the radiation source.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g., mirrors) configured to receive EUV radiation from an EUV radiation source and form it into a radiation beam to be directed at a mask. The mask inspection apparatus may further include optics (e.g., mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof.

Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source configured to generate EUV radiation by irradiating a fuel target with a radiation beam and configured to convert the fuel target into a plasma, wherein the radiation source comprises:
a beam apparatus having a reflector comprising a first plurality of reflecting facets and a second plurality of reflecting facets, the beam apparatus configured to receive an initiating radiation beam having a spatial intensity profile in a cross section of the initiating radiation beam and to modify the spatial intensity profile for providing the radiation beam having a modified spatial intensity profile, different from the spatial intensity profile;
wherein the beam apparatus is configured to create the modified spatial intensity profile having a greater homogeneity than the spatial intensity profile, and
wherein the first plurality of reflecting facets are each tilted at a first angle and the second plurality of reflecting facets are each tilted at a second angle that is different from the first angle.

2. The radiation source of claim 1, wherein the beam apparatus is operative to spatially distribute local intensities of the spatial intensity profile for creating the modified spatial intensity profile.

3. The radiation source of claim 1, wherein the beam apparatus is operative to create multiple, partially overlapping images of the initiating radiation beam for creating the radiation beam with the modified spatial intensity profile.

4. The radiation source of claim 2, wherein the beam apparatus is operative to create multiple, partially overlapping images of the initiating radiation beam for creating the radiation beam with the modified spatial intensity profile.

5. The radiation source of claim 1, wherein:
the modified spatial intensity profile has local modified intensities; and
the beam apparatus is configured to provide the radiation beam wherein a respective magnitude of each respective one of the local modified intensities is higher than a predetermined threshold value.

6. The radiation source of claim 5, wherein the predetermined threshold value is representative of a threshold intensity sufficient for converting at least part of the fuel target into the plasma.

7. The radiation source of claim 1, wherein the beam apparatus is operative to modify the spatial intensity profile in dependence on a degree of homogeneity of the spatial intensity profile.

8. The radiation source of claim 2, wherein the beam apparatus is operative to modify the spatial intensity profile in dependence on a degree of homogeneity of the spatial intensity profile.

9. The radiation source of claim 1, wherein:
the beam apparatus is operative to create multiple, partially overlapping images of the initiating radiation beam for creating the radiation beam with the modified spatial intensity profile; and
the beam apparatus is operative to modify the spatial intensity profile in dependence on a degree of homogeneity of the spatial intensity profile.

10. The radiation source of claim 2, wherein:
the beam apparatus is operative to create multiple, partially overlapping images of the initiating radiation beam for creating the radiation beam with the modified spatial intensity profile; and
the beam apparatus is operative to modify the spatial intensity profile in dependence on a degree of homogeneity of the spatial intensity profile.

11. The radiation source of claim 1, wherein:
each of the first plurality of reflecting facets is configured to reflect the incident initiating radiation beam in a first direction; and
each of the second plurality of reflecting facets is configured to reflect the incident initiating radiation beam in a second direction different from the first direction.

12. The radiation source of claim 11, comprising an actuator system operating on the reflector and configured to control at least the first direction or the second direction.

13. A lithographic system configured to image a pattern onto a substrate using EUV radiation, comprising:
a radiation source configured to generate the EUV radiation by irradiating a fuel target with a radiation beam and configured to convert the fuel target into a plasma, wherein the radiation source comprises:
a beam apparatus having a reflector comprising a first plurality of reflecting facets and a second plurality of reflecting facets, the beam apparatus configured to receive an initiating radiation beam having a spatial intensity profile in a cross section of the initiating radiation beam and to modify the spatial intensity profile for providing the radiation beam having a modified spatial intensity profile, different from the spatial intensity profile;
wherein the beam apparatus is configured to create the modified spatial intensity profile having a greater homogeneity than of the spatial intensity profile, and
wherein the first plurality of reflecting facets are each tilted at a first angle and the second plurality of reflecting facets are each tilted at a second angle that is different from the first angle.

14. The lithographic system of claim 13, wherein the beam apparatus is operative to spatially distribute local intensities of the spatial intensity profile for creating the modified spatial intensity profile.

15. The lithographic system of claim 13, wherein the beam apparatus is operative to create multiple, partially overlapping images of the initiating radiation beam for creating the radiation beam with the modified spatial intensity profile.

16. The lithographic system of claim 13, wherein:
the modified spatial intensity profile has local modified intensities; and
the beam apparatus is configured to provide the radiation beam wherein a respective magnitude of each respective one of the local modified intensities is higher than a predetermined threshold value.

17. The lithographic system of claim 16, wherein the predetermined threshold value is representative of a threshold intensity sufficient for converting at least part of the fuel target into the plasma.

18. The lithographic system of claim 13, wherein the beam apparatus is operative to modify the spatial intensity profile in dependence on a degree of homogeneity of the spatial intensity profile.

19. The lithographic system of claim 13, wherein:
the beam apparatus is operative to create multiple, partially overlapping images of the initiating radiation beam for creating the radiation beam with the modified spatial intensity profile; and
the beam apparatus is operative to modify the spatial intensity profile in dependence on a degree of homogeneity of the spatial intensity profile.

20. The lithographic system of claim 13, wherein:
each of the first plurality of reflecting facets is operative configured to reflect the incident initiating radiation beam in a first direction; and
each of the second plurality of reflecting facets is configured to reflect the incident initiating radiation beam in a second direction different from the first direction.

21. The radiation source of claim 1, wherein:
surfaces of each of the first plurality of reflecting facets are aligned along a first plane, and
surfaces of each of the second plurality of reflecting facets are aligned along a second plane that is different from the first plane.

22. The lithographic system of claim 13, wherein:
surfaces of each of the first plurality of reflecting facets are aligned along a first plane, and
surfaces of each of the second plurality of reflecting facets are aligned along a second plane that is different from the first plane.

23. The radiation source of claim 1, further comprising:
a second beam apparatus having a reflector comprising:
a third plurality of reflecting facets; and
a fourth plurality of reflecting facets,
wherein the second beam apparatus is configured to receive the radiation beam having the modified spatial intensity profile and to further modify the modified spatial intensity profile to provide an enhanced spatial intensity profile having a greater homogeneity than the modified spatial intensity profile.

24. The lithographic system of claim 13, wherein the radiation source further comprises:
a second beam apparatus having a reflector comprising:
a third plurality of reflecting facets; and
a fourth plurality of reflecting facets,
wherein the second beam apparatus is configured to receive the radiation beam having the modified spatial intensity profile and to further modify the modified spatial intensity profile to provide an enhanced spatial intensity profile having a greater homogeneity than the modified spatial intensity profile.

* * * * *

UNITED STATES PATENT AND TRADEMARK OFFICE
CERTIFICATE OF CORRECTION

PATENT NO. : 9,835,950 B2  
APPLICATION NO. : 15/112602  
DATED : December 5, 2017  
INVENTOR(S) : Eurlings et al.

Page 1 of 1

It is certified that error appears in the above-identified patent and that said Letters Patent is hereby corrected as shown below:

In the Claims

Claim 20, Column 29, Line 28, delete "operative".

Signed and Sealed this
Twelfth Day of June, 2018

Andrei Iancu
*Director of the United States Patent and Trademark Office*